(12) United States Patent
Lu et al.

(10) Patent No.: US 11,348,854 B2
(45) Date of Patent: May 31, 2022

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: I-Chia Lu, Kaohsiung (TW); Mao-Sung Hsu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 272 days.

(21) Appl. No.: 16/415,993

(22) Filed: May 17, 2019

(65) Prior Publication Data

US 2020/0365478 A1 Nov. 19, 2020

(51) Int. Cl.
*H01L 23/495* (2006.01)
*H01L 23/31* (2006.01)
*H01L 25/16* (2006.01)
*H01L 21/78* (2006.01)
*H01L 23/538* (2006.01)
*H01L 21/56* (2006.01)
*H01L 21/48* (2006.01)

(52) U.S. Cl.
CPC ........ *H01L 23/315* (2013.01); *H01L 21/4853* (2013.01); *H01L 21/56* (2013.01); *H01L 21/78* (2013.01); *H01L 23/3128* (2013.01); *H01L 23/5385* (2013.01); *H01L 23/5389* (2013.01); *H01L 25/162* (2013.01)

(58) Field of Classification Search
CPC ............. H01L 23/315; H01L 23/5385; H01L 23/5389; H01L 25/162; H01L 21/56
USPC ........................................ 257/668, 787, 686
See application file for complete search history.

(56) References Cited

U.S. PATENT DOCUMENTS

| | | | | |
|---|---|---|---|---|
| 6,069,023 | A | * | 5/2000 | Bernier .................. H01L 24/31 438/107 |
| 6,114,763 | A | * | 9/2000 | Smith .................... H01L 21/563 257/692 |
| 7,898,093 | B1 | * | 3/2011 | Darveaux ............. H01L 23/562 257/787 |
| 7,989,950 | B2 | | 8/2011 | Park et al. |
| 8,883,561 | B2 | * | 11/2014 | Park ......................... H01L 24/06 438/107 |
| 9,034,696 | B2 | * | 5/2015 | Mohammed ............ H01L 23/28 438/117 |
| 2005/0156311 | A1 | * | 7/2005 | Hashimoto ......... H01L 23/3121 257/730 |
| 2017/0188458 | A1 | * | 6/2017 | Hsieh ..................... H05K 1/115 |

* cited by examiner

*Primary Examiner* — Nitin Parekh
(74) *Attorney, Agent, or Firm* — Foley & Lardner LLP

(57) ABSTRACT

A semiconductor package structure includes a package substrate, an encapsulant, at least one passage and at least one semiconductor element. The encapsulant is disposed on the package substrate and has a peripheral surface, and includes a first encapsulant portion and a second encapsulant portion spaced apart from the first encapsulant portion. The at least one passage is defined by the first encapsulant portion and the second encapsulant portion, and the passage has at least one opening in the peripheral surface of the encapsulant. The at least one semiconductor element is disposed on the package substrate and exposed in the passage.

20 Claims, 41 Drawing Sheets

000# SEMICONDUCTOR PACKAGE STRUCTURE AND METHOD FOR MANUFACTURING THE SAME

BACKGROUND

1. Field of the Disclosure

The present disclosure relates to a semiconductor package structure and a manufacturing method, and to a semiconductor package structure including at least one passage and a method for manufacturing the semiconductor package structure.

2. Description of the Related Art

In response to the trend of electronic elements become lighter, thinner and smaller, semiconductor packages are stacked (for example, three dimensionally (3D) stacked) to integrate different elements and substantially reduce overall size through vertical integration. However, in comparative 3D stacked structures, the elements of an intermediate layer are covered by a compound, thus the heat generated by the elements while in operation is more difficult to dissipate. Moreover, in the 3D stacked structure, it is difficult to form a structure for exposing element(s) directly in the intermediate layer by molding or other processing means (for example, laser or plasma).

SUMMARY

In some embodiments, a semiconductor package structure includes a package substrate, an encapsulant, at least one passage and at least one semiconductor element. The encapsulant is disposed on the package substrate and has a peripheral surface, and includes a first encapsulant portion and a second encapsulant portion spaced apart from the first encapsulant portion. The at least one passage is defined by the first encapsulant portion and the second encapsulant portion, and the passage has at least one opening in the peripheral surface of the encapsulant. The at least one semiconductor element is disposed on the package substrate and exposed in the passage.

In some embodiments, a semiconductor package structure includes a package substrate; an encapsulant including a plurality of encapsulant portions; a module substrate disposed on and in direct contact with the encapsulant portions; and at least one semiconductor element disposed on the package substrate and between the encapsulant portions. The encapsulant is disposed on the package substrate, and each of the encapsulant portions includes a respective inner lateral surface, a respective outer lateral surface opposite to the respective inner lateral surface and a respective upper surface extended between the respective inner lateral surface and the respective outer lateral surface, wherein the respective inner lateral surfaces of the encapsulant portions define a passage, and a flatness of the respective inner lateral surface is less than a flatness of the respective upper surface.

In some embodiments, a method for manufacturing a semiconductor package structure includes: (a) providing a package substrate with at least one semiconductor element disposed thereon; (b) forming at least one cover material on the package substrate to cover the semiconductor element; (c) forming an encapsulant on the package substrate to cover the cover material, wherein at least one end surface of the cover material is exposed from the encapsulant; and (d) removing the cover material to form at least one passage.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
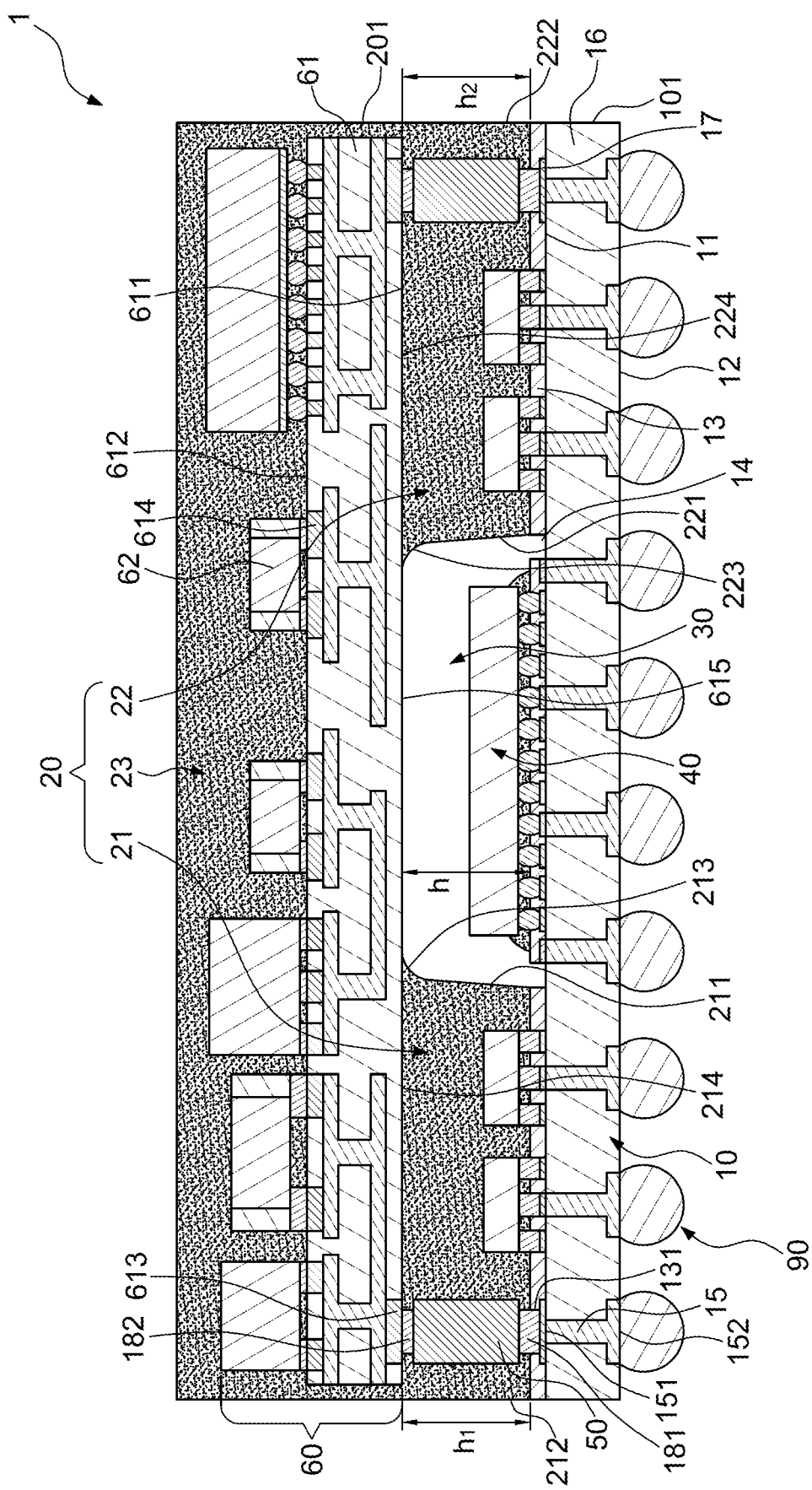
FIG. 1 illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a comparative semiconductor package structure, at least one semiconductor element is covered by a compound. However, a thermal conductivity of the compound is poor, thus the heat generated by the semiconductor element while in operation is difficult to dissipate through the compound.

To address the above concerns, in some comparative semiconductor package structures, a square cavity extending through a compound is formed to expose a semiconductor element. The square cavity is surrounded by the compound and has a top opening in a top surface of the compound. The heat generated by the semiconductor element while in operation may be dissipated through the top opening. However, air does not readily flow in and out of the square cavity to directly contact the semiconductor element and dissipate the heat generated by the semiconductor element—rather, the heat generated by the semiconductor element is dissipated through flowed air above the top opening. This can result in poor heat dissipation.

At least some embodiments of the present disclosure provide for a semiconductor package structure which has improved heat dissipation. In some embodiments, the semiconductor package structure includes at least one passage that allows air to flow in and out (e.g., to readily directly contact a semiconductor element). At least some embodiments of the present disclosure further provide for techniques for manufacturing the semiconductor package structure.

FIG. 1 illustrates a cross-sectional view of a semiconductor package structure 1 according to some embodiments of the present disclosure. The semiconductor package structure 1 includes a package substrate 10, an encapsulant 20, at least one passage 30, at least one semiconductor element 40, at least one interposer 50 and at least one assembly module 60. In some embodiments, the semiconductor package structure 1 may be a three dimensional (3D) stacked semiconductor package structure, or a non-stacked semiconductor package structure.

The package substrate 10 includes a dielectric structure 16, an insulation layer 13 and a plurality of conductive elements 15 and a circuit layer 17. The dielectric structure 16 has a first surface 11 and a second surface 12 opposite to the first surface 11. The circuit layer 17 is disposed adjacent to the first surface 11 of the dielectric structure 16. The insulation layer 13 is disposed on the first surface 11 of the dielectric structure 16. The insulation layer 13 defines at least one groove 14 and a plurality of openings 131 extending through the insulation layer 13. The groove 14 exposes a portion of the first surface 11 of the dielectric structure 16, and the openings 131 expose a portion of the circuit layer 17. The conductive elements 15 (e.g., conductive vias) are embedded in and extend through the dielectric structure 16. Each of the conductive elements 15 includes a first end 151 exposed from the first surface 11 and a second end 152 exposed from the second surface 12. In some embodiments, a portion of the circuit layer 17 may be disposed on and electrically connected to the first ends 151 of the conductive elements 15.

For the 3D stacked semiconductor package structure, the at least one interposer 50 may be disposed on and electrically connected to the package substrate 10 and the at least one assembly module 60 may be disposed on and electrically connected to the interposer 50.

The interposer 50 may be, for example, a substrate interposer, silicon interposer, a through-silicon via (TSV) interposer, a printed-circuit board, a high-density interconnect, or the like. In some embodiments, the interposer 50 is disposed on and electrically connected to the exposed portion of the circuit layer 17 through at least one solder bump 181.

The assembly module 60 includes a module substrate 61 and at least one electronic component 62 (e.g., a semiconductor chip and/or a passive component). The module substrate 61 is disposed on and electrically connected to the interposer 50. The module substrate 61 has a bottom surface 611 facing the interposer 50 and a top surface 612 opposite to the bottom surface 611, and includes a plurality of first bonding pads 613 in proximity to, adjacent to, or embedded and exposed at the bottom surface 611 and a plurality of second bonding pads 614 in proximity to, adjacent to, or embedded and exposed at the top surface 612. The electronic component 62 may be electrically connected to the second bonding pads 614 of the module substrate 61. In some embodiments, the first bonding pads 613 of the module substrate 61 may be electrically connected to the interposer 50 through a plurality of solder bumps 182.

The encapsulant 20 is disposed on the package substrate 10, and a material of the encapsulant 20 may be a molding compound with or without fillers. The encapsulant 20 may cover the interposer 50 and the assembly module 60 (including the module substrate 61 and the electronic component 62). The encapsulant 20 includes a first encapsulant portion 21, a second encapsulant portion 22 spaced apart from the first encapsulant portion 21 and a third encapsulant portion 23 above the first encapsulant portion 21 and the second encapsulant portion 22. In some embodiments, the first encapsulant portion 21, the second encapsulant portion 22 and the third encapsulant portion 23 are formed integrally (e.g. and concurrently) as a monolithic structure. The third encapsulant portion 23 may connect the first encapsulant portion 21 and the second encapsulant portion 22. A peripheral surface 101 of the package substrate 10 may be substantially coplanar with a peripheral surface 201 of the encapsulant 20. The encapsulant 20 covers the peripheral surface of the module substrate 61.

The first encapsulant portion 21 and the second encapsulant portion 22 cover the interposer 50 and the insulation layer 13 of the package substrate 10. As shown in FIG. 1, the module substrate 61 is disposed on and is in direct contact with the first encapsulant portion 21 and the second encapsulant portion 22, thus the first encapsulant portion 21 and the second encapsulant portion 22 may contact and cover a portion of the bottom surface 611 of the module substrate 61. The module substrate 61 may include a bottom exposed area 615 (e.g. a portion of the bottom surface 611 that is not covered by the first encapsulant portion 21 and is not covered by the second encapsulant portion 22). The bottom exposed area 615 is located between the first encapsulant portion 21 and the second encapsulant portion 22.

The first encapsulant portion 21 includes a respective inner lateral surface 211, a respective outer lateral surface 212 opposite to the respective inner lateral surface 211, an arc chamfer portion 213 extending from, or constituting part of, one end of the respective inner lateral surface 211 and a respective upper surface 214 extended between the respective inner lateral surface 211 and the respective outer lateral surface 212. The arc chamfer portion 213 may curve towards the passage 30 such that the first encapsulant portion 21 extends towards the passage 30. In some embodiments, the respective upper surface 214 may contact the portion of the bottom surface 611 of the module substrate 61.

The second encapsulant portion 22 includes a respective inner lateral surface 221 opposite to the respective inner lateral surface 211 of the first encapsulant portion 21, a respective outer lateral surface 222 opposite to the respective inner lateral surface 221, an arc chamfer portion 223 extending from, or constituting one end of, the respective inner lateral surface 221 and a respective upper surface 224 extended between the respective inner lateral surface 221 and the respective outer lateral surface 222. The arc chamfer portion 223 may curve towards the passage 30 such that the second encapsulant portion 22 extends towards the passage 30. In some embodiments, the respective upper surface 224 may contact the portion of the bottom surface 611 of the module substrate 61.

In some embodiments, a height h1 of the first encapsulant portion 21 may be about equal to a height h2 of the second encapsulant portion 22.

The third encapsulant portion 23 covers the assembly module 60. In some embodiments, the third encapsulant portion 23 may be connected to the first encapsulant portion 21 and the second encapsulant portion 22.

In some embodiments, the passage 30 may be located between the first encapsulant portion 21 and the second encapsulant portion 22. The respective inner lateral surface 211 of the first encapsulant portion 21 and the respective inner lateral surface 221 of the second encapsulant portion 22 face the passage 30, thus the respective inner lateral surfaces 211, 221 may define the passage 30. In some embodiments, the passage 30 may be further defined by the package substrate 10 and the assembly module 60.

The arc chamfer portion 213 of the first encapsulant portion 21 and the arc chamfer portion 223 of the second encapsulant portion 22 may curve toward the passage 30 (e.g., may respectively curve in a direction away from the respective outer lateral surface 212 and the respective outer lateral surface 222). The groove 14 of the package substrate 10 may communicate with the passage 30, and the bottom exposed area 615 of the module substrate 61 is exposed in the passage 30.

In some embodiments, a height h of the passage 30 may be less than or about equal to the height h1 of the first encapsulant portion 21 or the height h2 of the second encapsulant portion 22. The height h of the passage 30 may be, for example, a shortest distance between the first surface 11 of the dielectric structure 16 to the bottom exposed area 615 of the module substrate 61.

The semiconductor element 40 may be, for example, a semiconductor die or a semiconductor chip. The semiconductor element 40 is disposed on and electrically connected to the package substrate 10 and exposed (or accommodated) in the passage 30. The semiconductor element 40 is disposed between the first encapsulant portion 21 and the second encapsulant portion 22. Thus, the heat generated by the semiconductor element 40 while in operation may be dissipated through the air or liquid flowing in and out of the passage 30.

As shown in FIG. 1, a plurality of solder bumps 90 may be mounted on the package substrate 10 for external connection. In some embodiments, the solder bumps 90 are mounted on the second ends 152 of the conductive elements 15.

Figure 2:
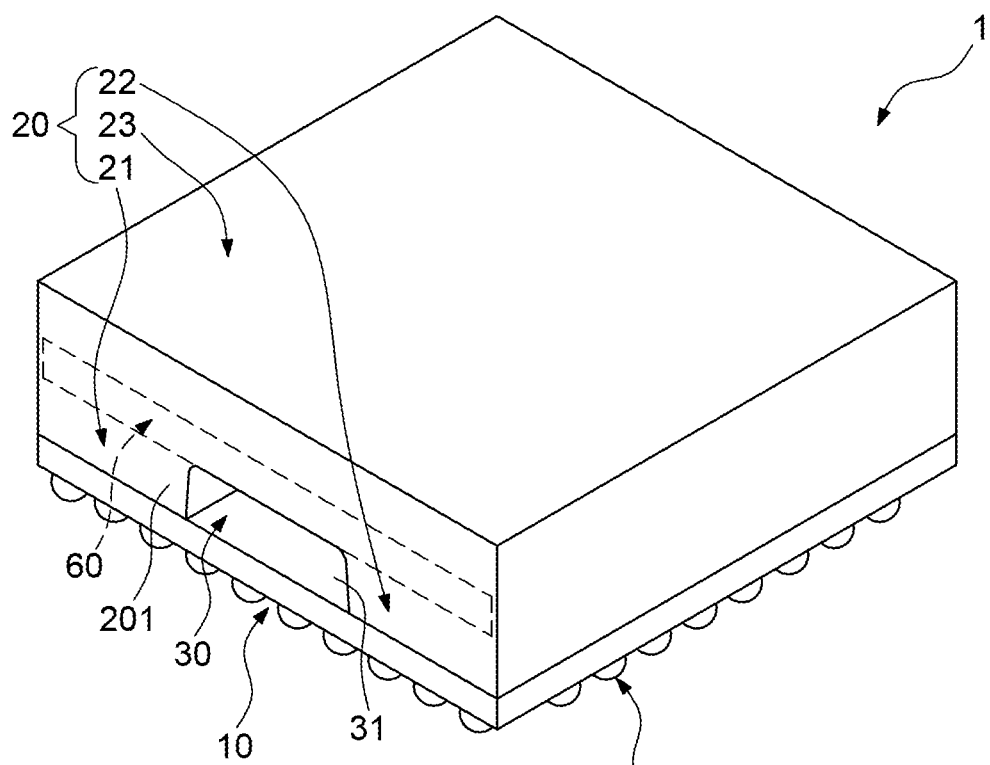
FIG. 2 illustrates a perspective view of FIG. 1.
Figure 3:
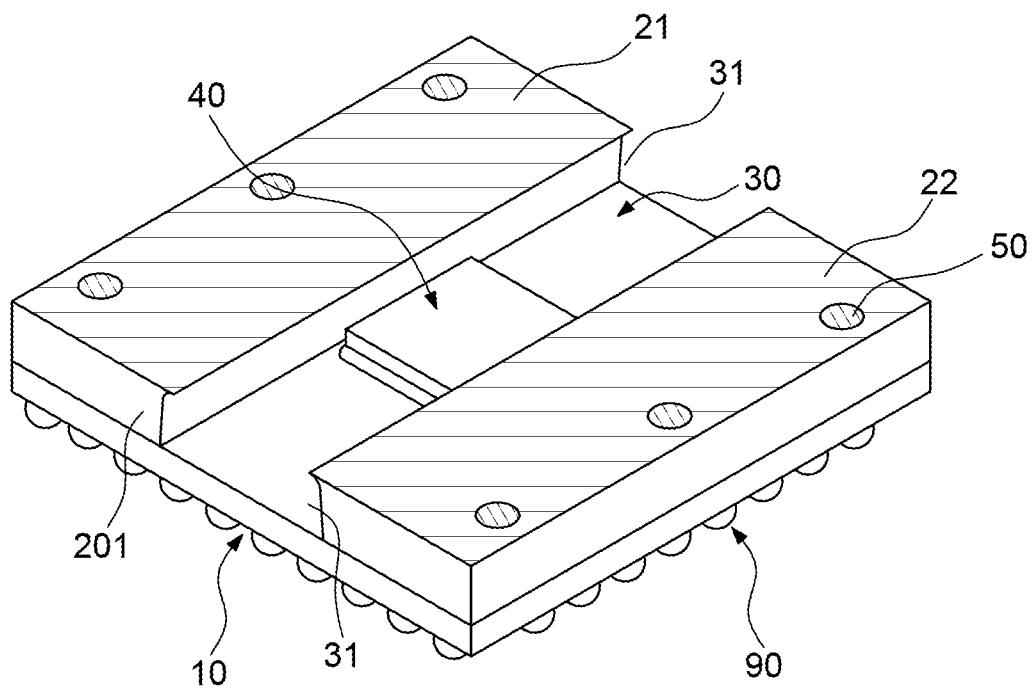
FIG. 3 illustrates a cross-sectional view of FIG. 2.

FIG. 2 illustrates a perspective view of FIG. 1. FIG. 3 illustrates a cross-sectional view of FIG. 2. Referring to FIGS. 1-3, the passage 30 is defined by the first encapsulant portion 21 and the second encapsulant portion 22, and the passage 30 may be (e.g. from a top view) in a straight line-shape, an L-shape, a T-shape, a Y-shape, a C-shape, a U-shape, an X-shape, or another shape. The passage 30 allows air or liquid to flow in and out.

As shown in FIG. 2, the passage 30 may have at least one opening 31 in the peripheral surface 201 of the encapsulant 20. Air or liquid may flow in and out of the passage 30 through the opening 31.

As shown in FIG. 3, in some embodiments, the passage 30 may be a channel, and may have two openings 31 in opposite peripheral surfaces 201 of the encapsulant 20. The air or liquid may flow in and out of the passage 30 through the openings 31. Due to the design of the passage 30, the flow of the air or liquid is smooth, and the flow speed of the air or liquid in the passage 30 of FIG. 1 to FIG. 3 is relatively greater than the flow speed of the air in the square cavity of comparative examples described herein. Thus, a heat dissipation of the air or liquid in passage 30 of FIG. 1 to FIG. 3 is more efficient than a heat dissipation of the air in the square cavity of the comparative example.

Figure 4:
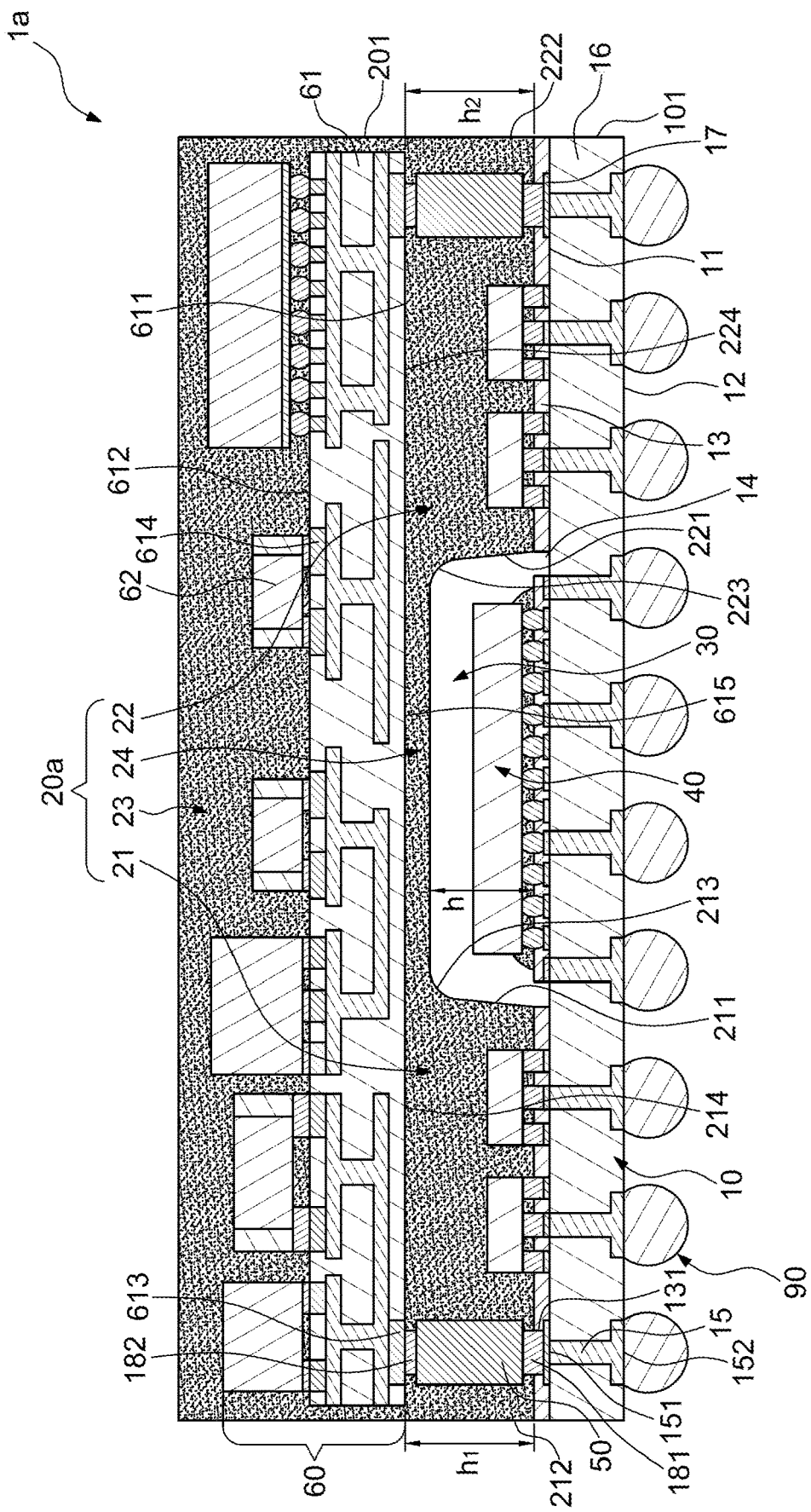
FIG. 4 illustrates a cross-sectional view of a semiconductor package structure according to some embodiments of the present disclosure.
Figure 5:
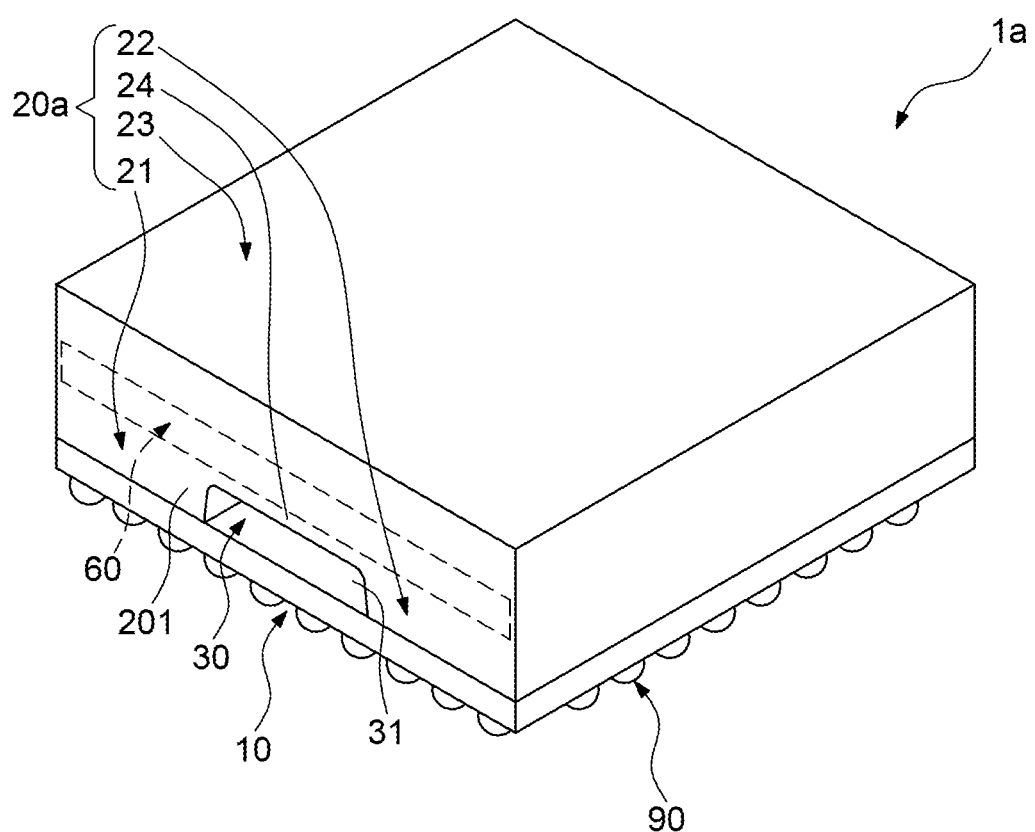
FIG. 5 illustrates a perspective view of FIG. 4.

FIG. 4 illustrates a cross-sectional view of a semiconductor package structure 1a according to some embodiments of the present disclosure. FIG. 5 illustrates a perspective view of FIG. 4. The semiconductor package structure 1a is similar to the semiconductor package structure 1 shown in FIG. 1 and FIG. 2, except for the structure of the encapsulant 20a. The encapsulant 20a of FIG. 4 further includes a bridge encapsulant portion 24 located above the passage 30 and connected to the first encapsulant portion 21 and the second encapsulant portion 22. The first encapsulant portion 21, the second encapsulant portion 22, the third encapsulant portion 23 and the bridge encapsulant portion 24 are formed integrally (e.g. and concurrently) as a monolithic structure. The passage 30 may be further defined by the bridge encapsulant portion 24 and the package substrate 10. The height h of the passage 30 is less than the height h1 of the first encapsulant portion 21 or the height h2 of the second encapsulant portion 22 (e.g., by a factor of about 0.9 or less, by a factor of about 0.8 or less, or by a factor of about 0.7 or less). An area of the opening 31 of FIG. 5 is less than an area of the opening 31 of FIG. 2 (e.g., may be about 0.9 times less, about 0.8 times less, about 0.7 times less, about 0.6 times less, or about 0.5 times less). However, because the area of the opening 31 is allows air or liquid to flow in and out of the passage 30, the heat generated by the semiconductor element 40 while in operation may still be dissipated.

Figure 6:
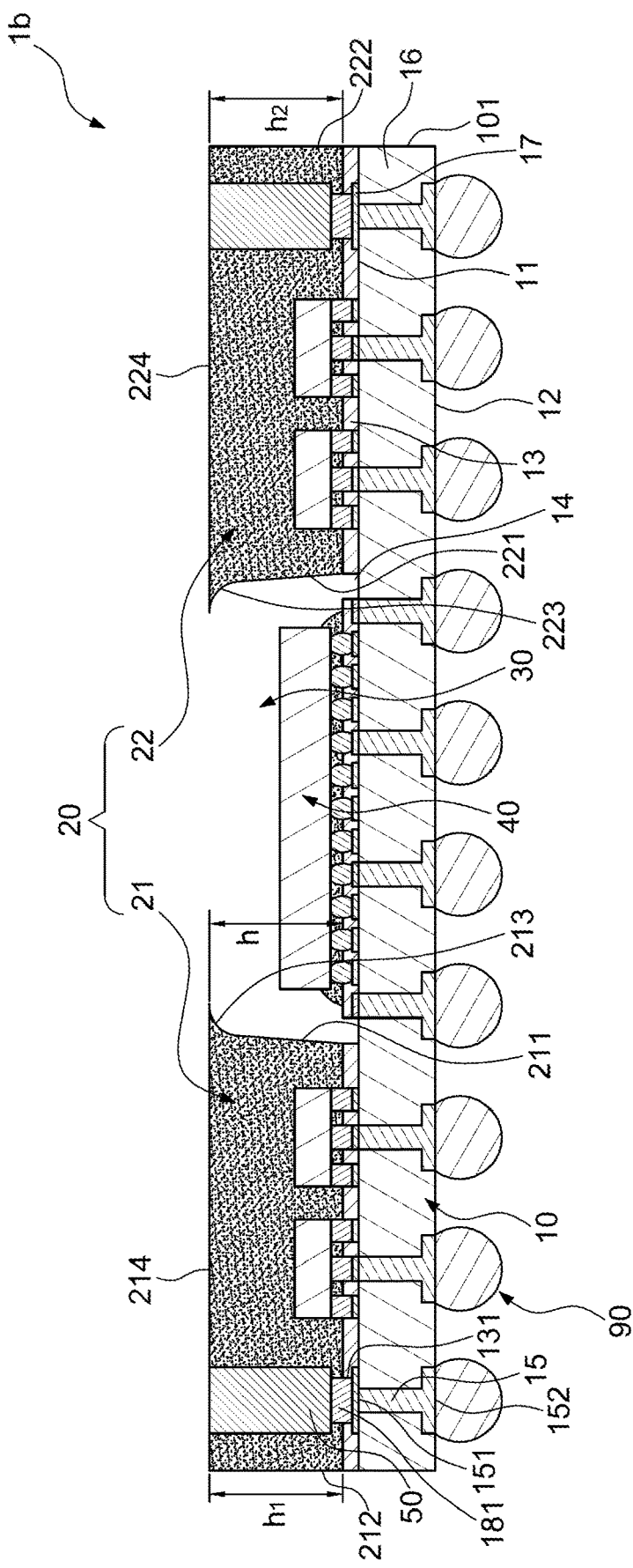
FIG. 6 illustrates a cross-sectional view of a semiconductor package structure according to some embodiments of the present disclosure.

FIG. 6 illustrates a cross-sectional view of a semiconductor package structure 1b according to some embodiments of the present disclosure. The semiconductor package structure 1b is a non-stacked semiconductor package structure. The semiconductor package structure 1b is similar to the semiconductor package structure 1 shown in FIG. 1, except that the third encapsulant portion 23 of the encapsulant 20 and the assembly module 60 of the semiconductor package structure 1 are omitted. In some embodiments, a portion of the interposer 50 may be exposed from the respective upper surface 214 of first encapsulant portion 21 or the respective upper surface 224 of the second encapsulant portion 22 for external connection.

Figure 7:
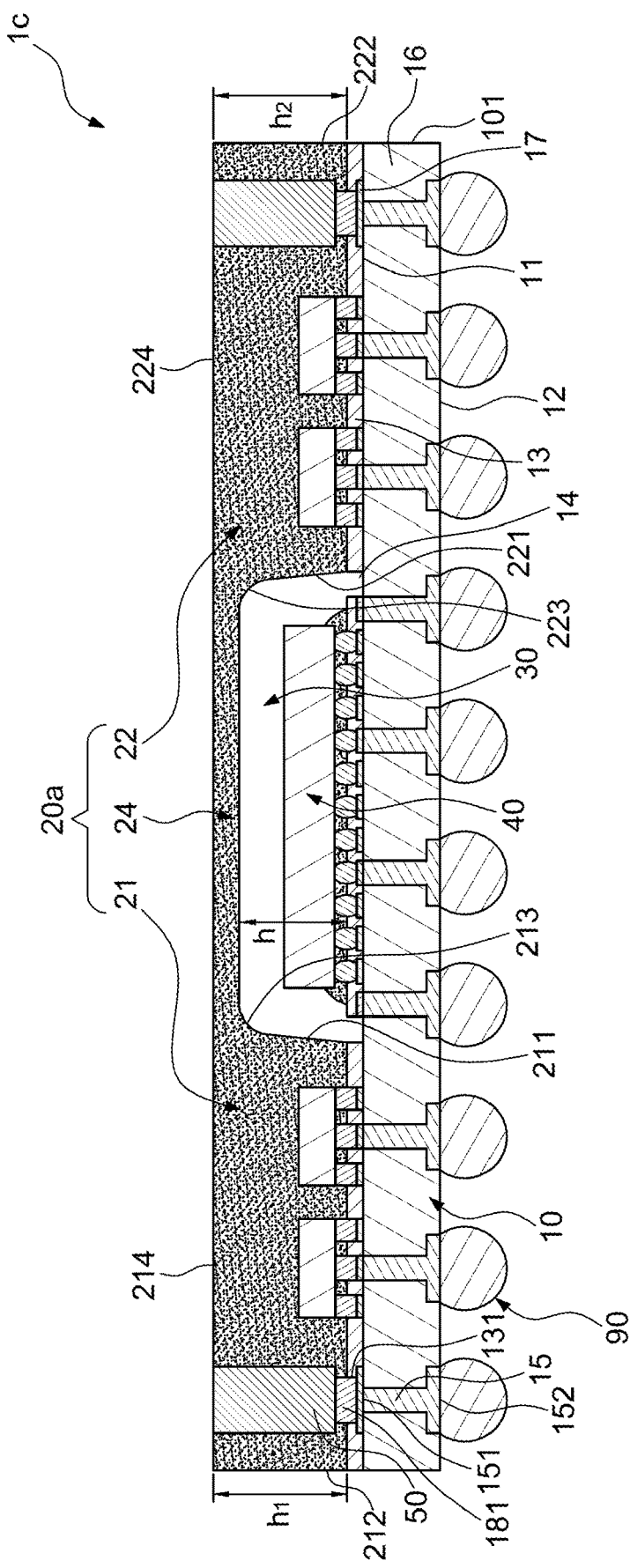
FIG. 7 illustrates a cross-sectional view of a semiconductor package structure according to some embodiments of the present disclosure.

FIG. 7 illustrates a cross-sectional view of a semiconductor package structure 1c according to some embodiments of the present disclosure. The semiconductor package structure 1c is a non-stacked semiconductor package structure. The semiconductor package structure 1c is similar to the semiconductor package structure 1a shown in FIG. 4, except that the third encapsulant portion 23 of the encapsulant 20a and the assembly module 60 of the semiconductor package structure 1a are omitted. In some embodiments, a portion of the interposer 50 may be exposed from the respective upper surface 214 of first encapsulant portion 21 or the respective upper surface 224 of the second encapsulant portion 22 for external connection.

Figure 8:
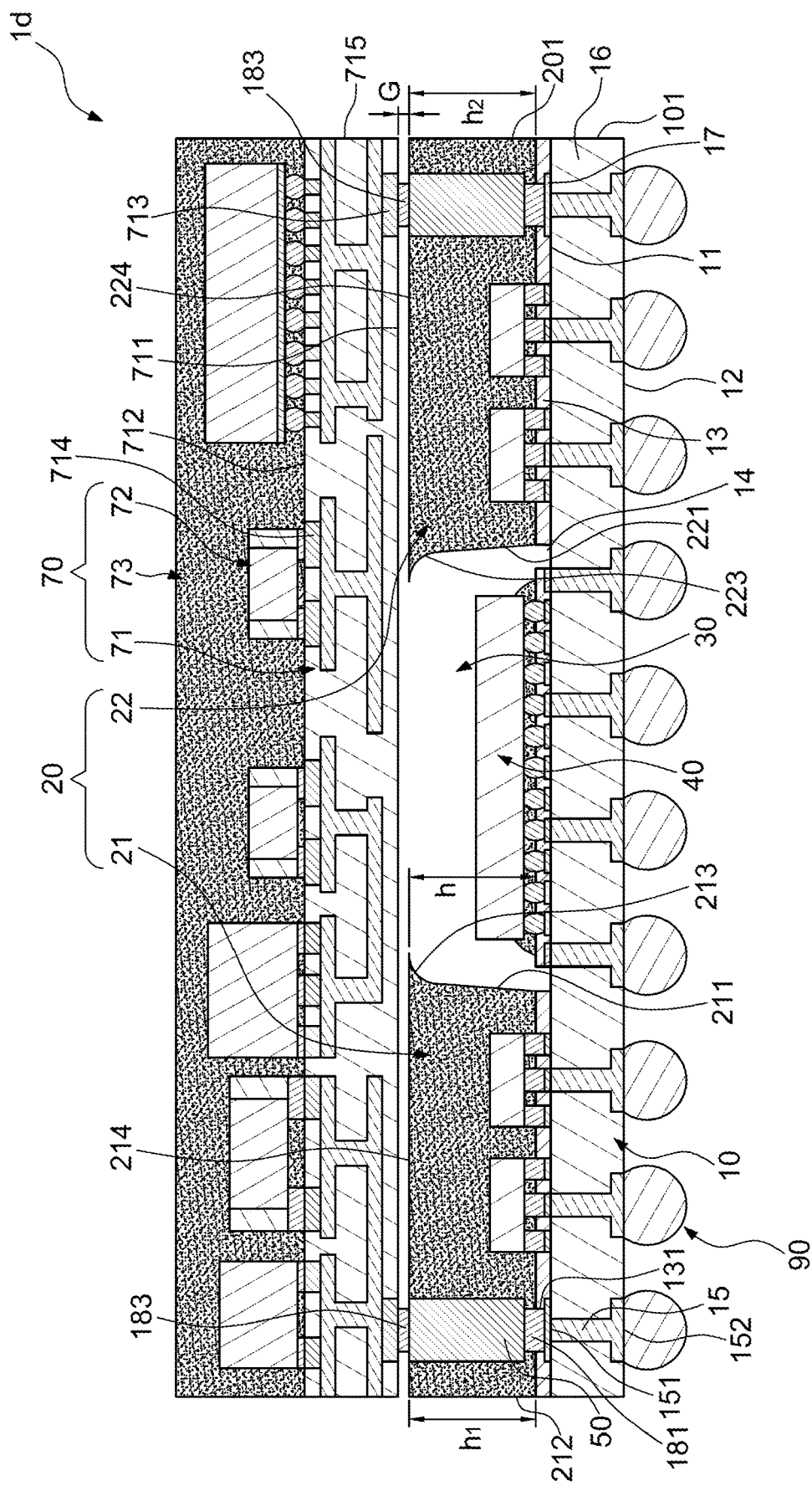
FIG. 8 illustrates a cross-sectional view of a semiconductor package structure according to some embodiments of the present disclosure.

FIG. 8 illustrates a cross-sectional view of a semiconductor package structure 1d according to some embodiments of the present disclosure. The semiconductor package structure 1d is similar to the semiconductor package structure 1b shown in FIG. 6, except that the semiconductor package structure 1d further includes a semiconductor device 70 disposed above the encapsulant 20 and electrically connected to the package substrate 10 through the interposer 50.

In some embodiments, there is a gap G between the semiconductor device 70 and the encapsulant 20.

The semiconductor device 70 includes a device substrate 71 disposed on and electrically connected to the interposer 50, at least one electronic component 72 disposed on and electrically connected to the device substrate 71 and an encapsulant 73 disposed on the device substrate 71 to cover the electronic component 72. The device substrate 71 includes a bottom surface 711 facing the interposer 50, a top surface 712 opposite to the bottom surface 711, a plurality of first bonding pads 713 exposed from the bottom surface 711 and a plurality of second bonding pads 714 exposed from the top surface 712. In some embodiments, the first bonding pads 713 of the device substrate 71 may be electrically connected to the interposer 50 through a plurality of solder bumps 183. The electronic component 72 may be electrically connected to the second bonding pads 714. The encapsulant 73 of the semiconductor device 70 and the encapsulant 20 may be formed non-concurrently.

In some embodiments, a peripheral surface 715 of the device substrate 71 may be substantially coplanar with the peripheral surface 201 of the encapsulant 20 and the peripheral surface 101 of the package substrate 10.

Figure 9:
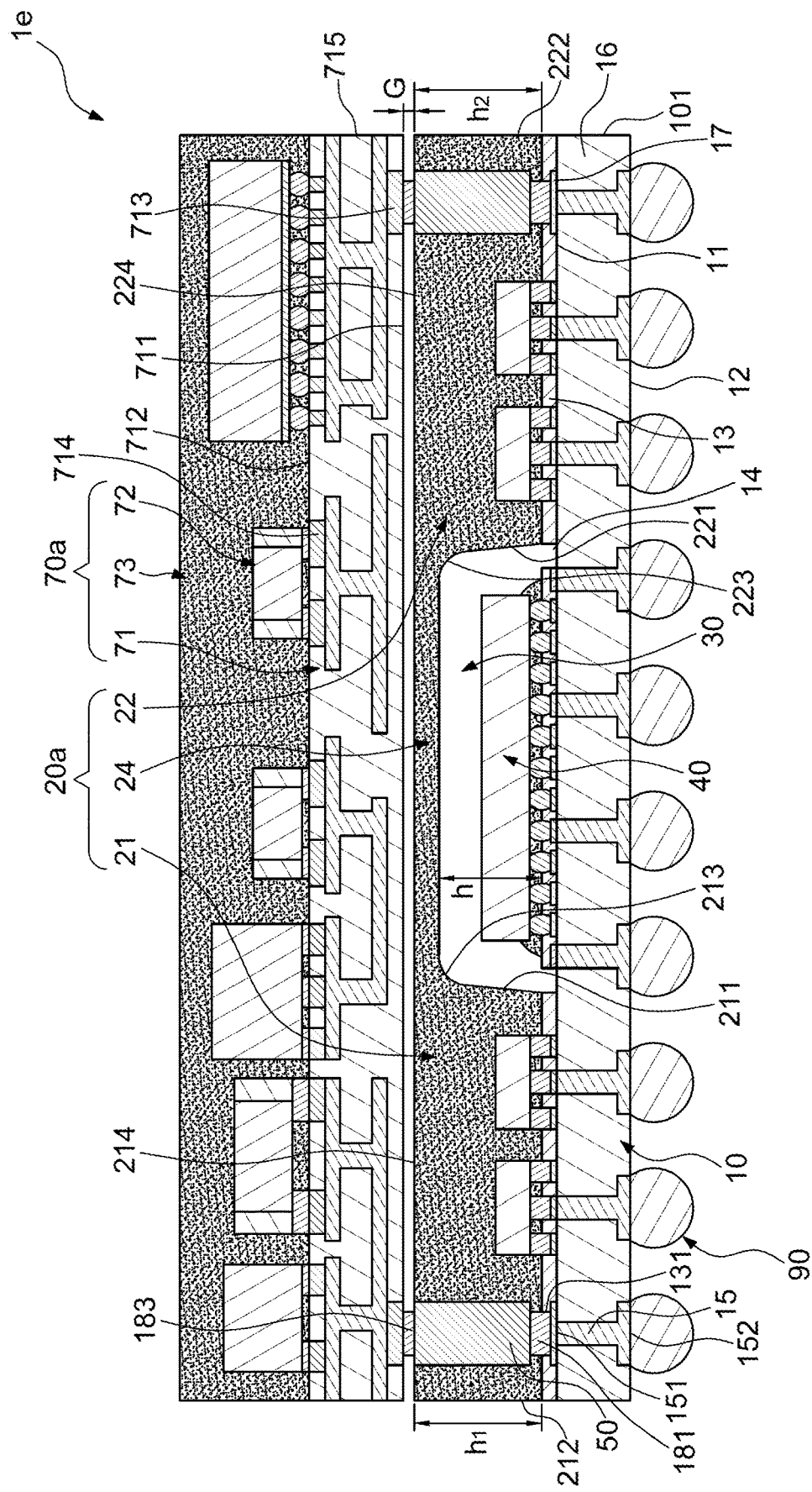
FIG. 9 illustrates a cross-sectional view of a semiconductor package structure according to some embodiments of the present disclosure.

FIG. 9 illustrates a cross-sectional view of a semiconductor package structure 1e according to some embodiments of the present disclosure. The semiconductor package structure 1e is similar to the semiconductor package structure 1c shown in FIG. 7, except that the semiconductor package structure 1e further includes a semiconductor device 70a disposed above the encapsulant 20a and electrically connected to the package substrate 10 through the interposer 50. In some embodiments, there is a gap G between the semiconductor device 70a and the encapsulant 20a.

The semiconductor device 70a includes a device substrate 71 disposed on and electrically connected to the interposer 50, at least one electronic component 72 disposed on and electrically connected to the device substrate 71 and an encapsulant 73 disposed on the device substrate 71 to cover the electronic component 72. The device substrate 71 includes a bottom surface 711 facing the interposer 50, a top surface 712 opposite to the bottom surface 711, a plurality of first bonding pads 713 exposed from the bottom surface 711 and a plurality of second bonding pads 714 exposed from the top surface 712. In some embodiments, the first bonding pads 713 of the device substrate 71 may be electrically connected to the interposer 50 through a plurality of solder bumps 183. The electronic component 72 may be electrically connected to the second bonding pads 714. The encapsulant 73 of the semiconductor device 70a and the encapsulant 20a may be formed non-concurrently.

In some embodiments, a peripheral surface 715 of the device substrate 71 may be substantially coplanar with the peripheral surface 201 of the encapsulant 20a and the peripheral surface 101 of the package substrate 10.

Figure 10:
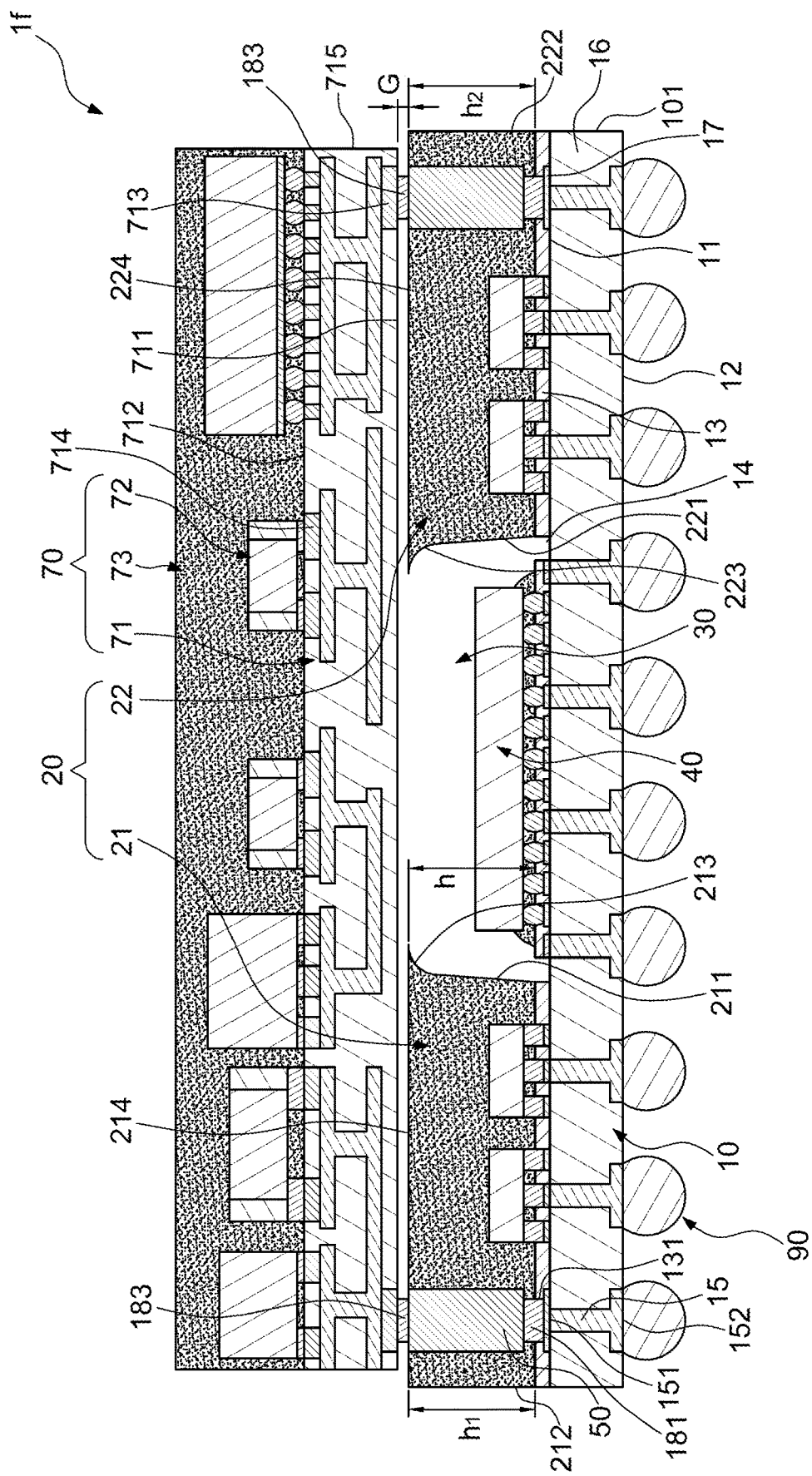
FIG. 10 illustrates a cross-sectional view of a semiconductor package structure according to some embodiments of the present disclosure.

FIG. 10 illustrates a cross-sectional view of a semiconductor package structure if according to some embodiments of the present disclosure. The semiconductor package structure if is similar to the semiconductor package structure 1d shown in FIG. 8, except for the configuration of the semiconductor device 70. The peripheral surface 715 of the device substrate 71 may be non-coplanar with the peripheral surface 201 of the encapsulant 20 and the peripheral surface 101 of the package substrate 10. In some embodiments, a size of the semiconductor device 70 (e.g. a longest dimension of the semiconductor device 70) may be smaller than a size of the package substrate 10 (e.g. a longest dimension of the package substrate 10), such as by a factor of about 0.95 or less, a factor of about 0.9 or less, or a factor of about 0.85 or less.

Figure 11:
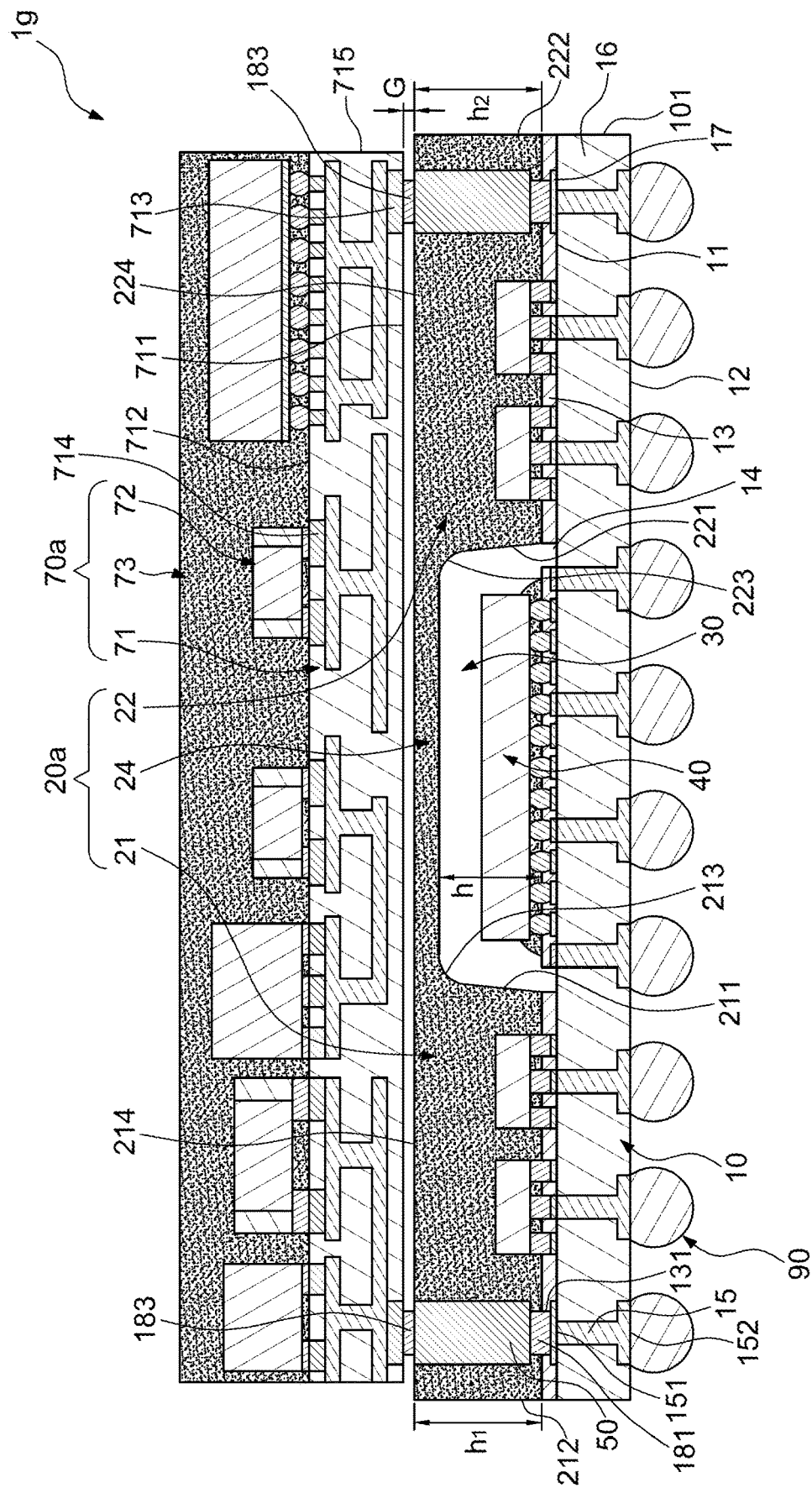
FIG. 11 illustrates a cross-sectional view of a semiconductor package structure according to some embodiments of the present disclosure.

FIG. 11 illustrates a cross-sectional view of a semiconductor package structure 1g according to some embodiments of the present disclosure. The semiconductor package structure 1g is similar to the semiconductor package structure 1e shown in FIG. 9, except for the configuration of the semiconductor device 70a. The peripheral surface 715 of the device substrate 71 may be non-coplanar with the peripheral surface 201 of the encapsulant 20a and the peripheral surface 101 of the package substrate 10. In some embodiments, a size of the semiconductor device 70a (e.g. a longest dimension of the semiconductor device 70a) may be smaller than a size of the package substrate 10 (e.g. a longest dimension of the package substrate 10) such as by a factor of about 0.95 or less, a factor of about 0.9 or less, or a factor of about 0.85 or less.

Figure 12:
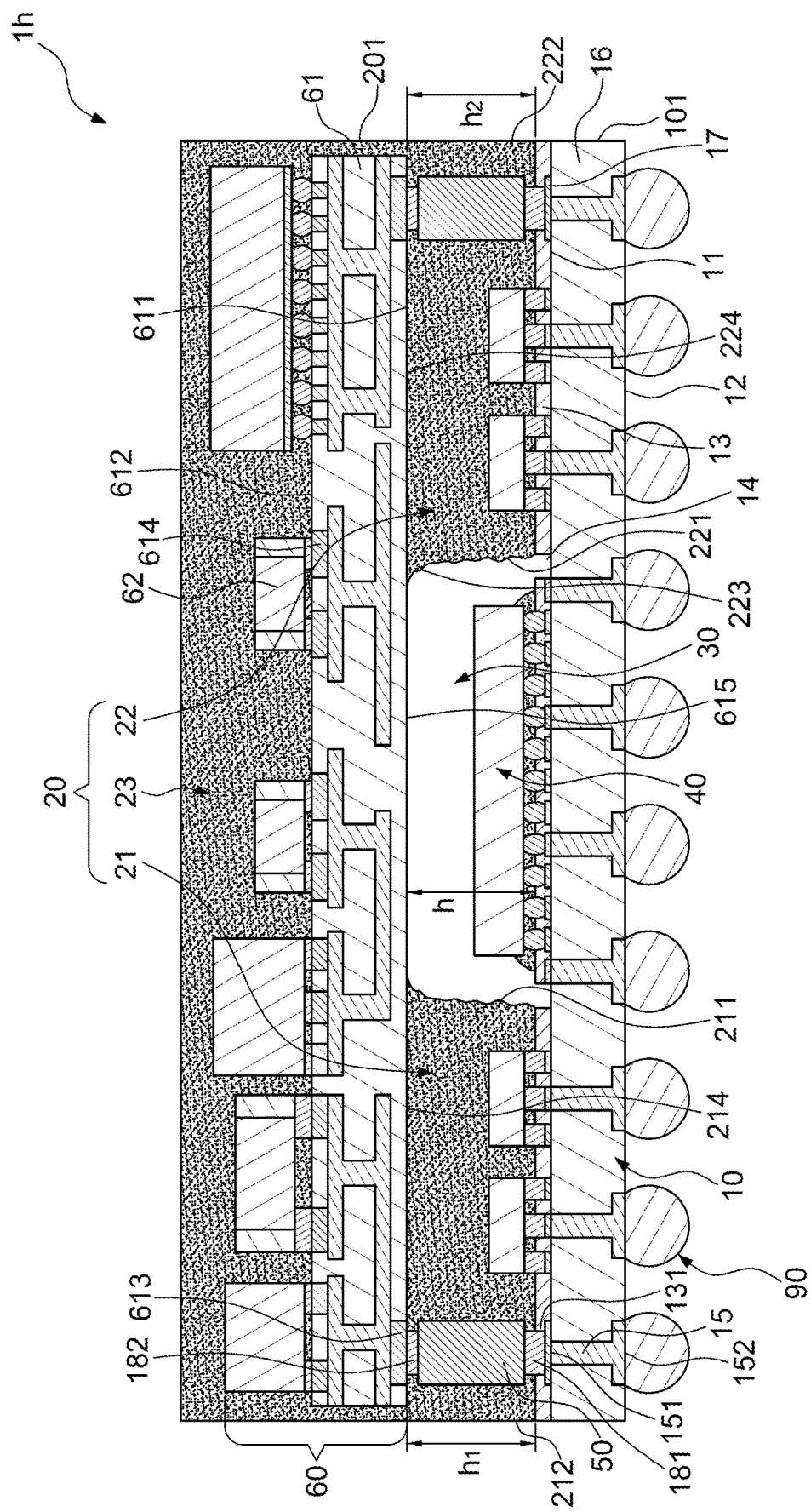
FIG. 12 illustrates a cross-sectional view of a semiconductor package structure according to some embodiments of the present disclosure.

FIG. 12 illustrates a cross-sectional view of a semiconductor package structure 1h according to some embodiments of the present disclosure. The semiconductor package structure 1h is similar to the semiconductor package structure 1 shown in FIG. 1, except for a surface flatness of the first encapsulant portion 21 and the second encapsulant portion 22. For the first encapsulant portion 21, a flatness of the respective inner lateral surface 211 is less than a flatness of the respective upper surface 214 or a flatness of the respective outer lateral surface 212, and a roughness of the respective inner lateral surface 211 is greater than a roughness of the respective upper surface 214 or a roughness of the respective outer lateral surface 212 (e.g., by a factor of about 1.1 or greater, about 1.3 or greater, or about 1.5 or greater in terms of root mean square surface roughness). For the second encapsulant portion 22, a flatness of the respective inner lateral surface 221 is less than a flatness of the respective upper surface 224 or a flatness of the respective outer lateral surface 222, and a roughness of the respective inner lateral surface 221 is greater than a roughness of the respective upper surface 224 or a roughness of the respective outer lateral surface 222 (e.g., by a factor of about 1.1 or greater, about 1.3 or greater, or about 1.5 or greater in terms of root mean square surface roughness).

Figure 13:
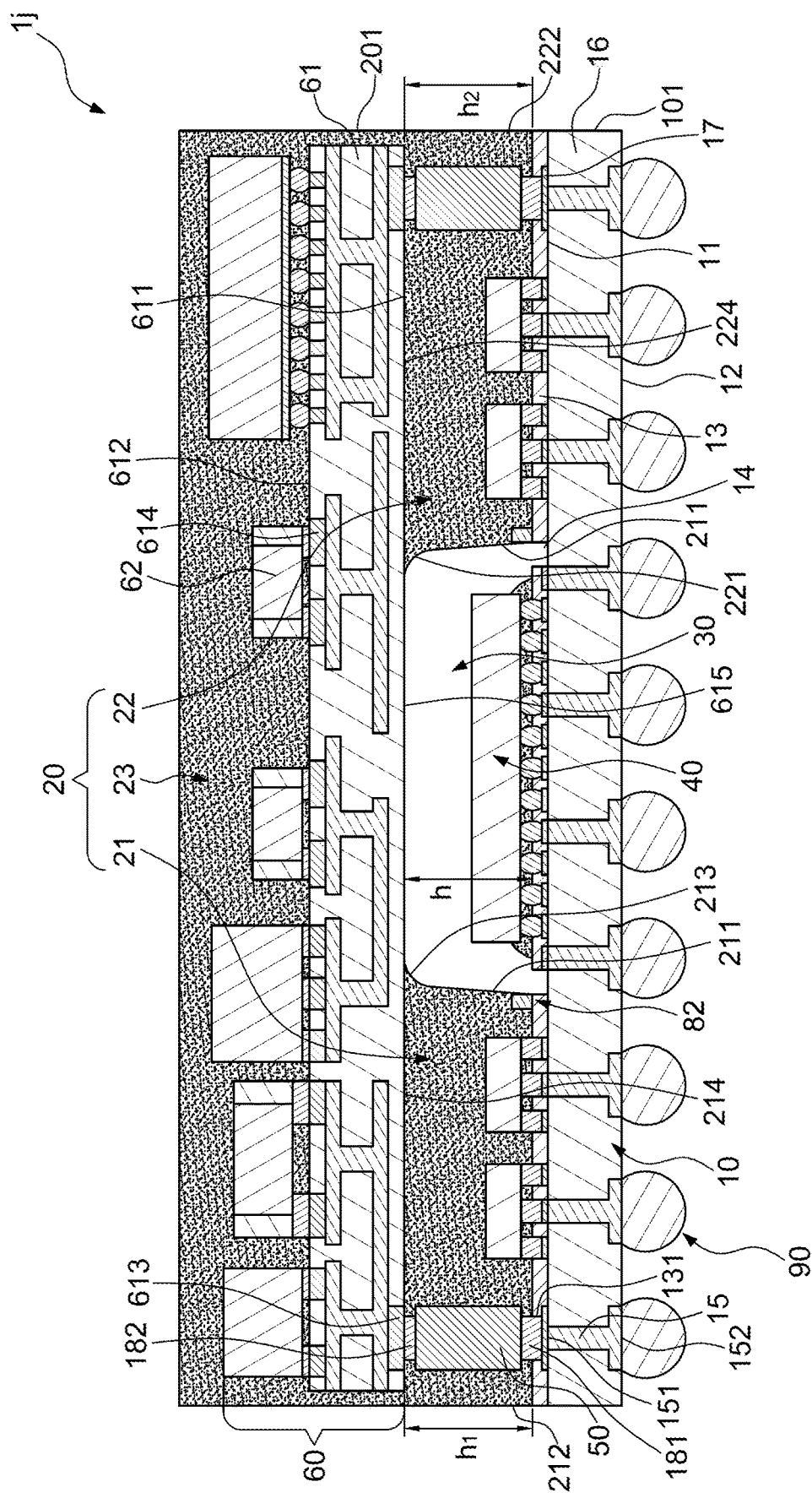
FIG. 13 illustrates a cross-sectional view of a semiconductor package structure according to some embodiments of the present disclosure.

FIG. 13 illustrates a cross-sectional view of a semiconductor package structure 1j according to some embodiments of the present disclosure. The semiconductor package structure 1j is similar to the semiconductor package structure 1 shown in FIG. 1, except that the semiconductor package structure 1j further includes at least one dam 82 disposed on the insulation layer 13 to surround the groove 14. The at least one dam 82 may be adjacent to the passage 30. The first encapsulant portion 21 and the second encapsulant portion 22 cover the at least one dam 82.

FIG. 14 through FIG. 18 illustrate a method for manufacturing a semiconductor package structure according to some embodiments of the present disclosure. In some embodiments, the method is for manufacturing a semiconductor package structure such as the semiconductor package structure 1 shown in FIG. 1.

Figure 14:
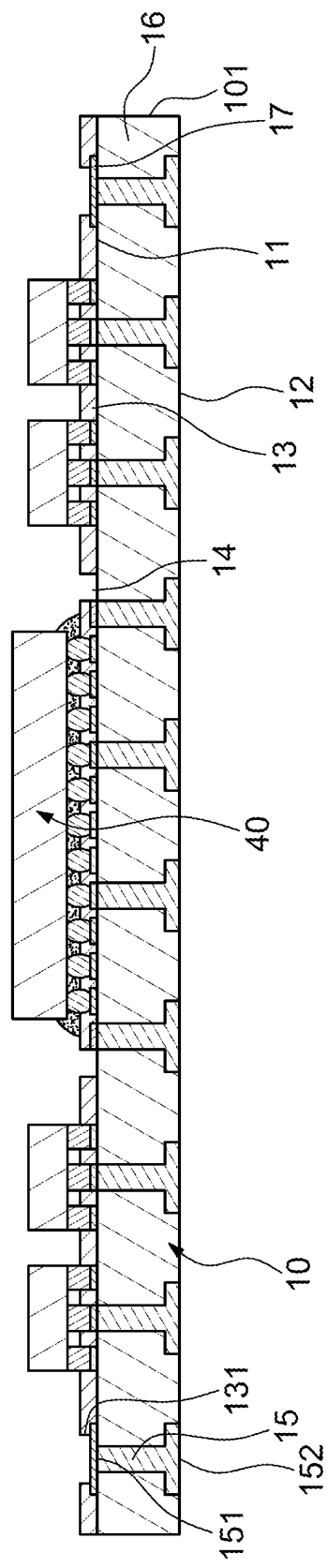
FIG. 14 illustrates one or more stages of an example of a method for manufacturing a semiconductor package structure according to some embodiments of the present disclosure.

Referring to FIG. 14, a package substrate 10 is provided, and at least one semiconductor element 40 is disposed on the package substrate 10. The package substrate 10 includes a dielectric structure 16, an insulation layer 13 and a plurality of conductive elements 15 and a circuit layer 17. The dielectric structure 16 has a first surface 11 and a second surface 12 opposite to the first surface 11. The circuit layer 17 is disposed adjacent to the first surface 11 of the dielectric structure 16. The insulation layer 13 is disposed on the first surface 11 of the dielectric structure 16. The insulation layer 13 defines at least one groove 14 and a plurality of openings 131 extending through the insulation layer 13. The groove 14 exposes a portion of the first surface 11 of the dielectric structure 16, and the openings 131 expose a portion of the circuit layer 17. The conductive elements 15 (e.g., conductive vias) are embedded in and extend through the dielectric structure 16. Each of the conductive elements 15 includes a first end 151 exposed from the first surface 11 and a second end 152 exposed from the second surface 12. In some embodiments, a portion of the circuit layer 17 may be disposed on and electrically connected to the first ends 151 of the conductive elements 15.

Figure 15:
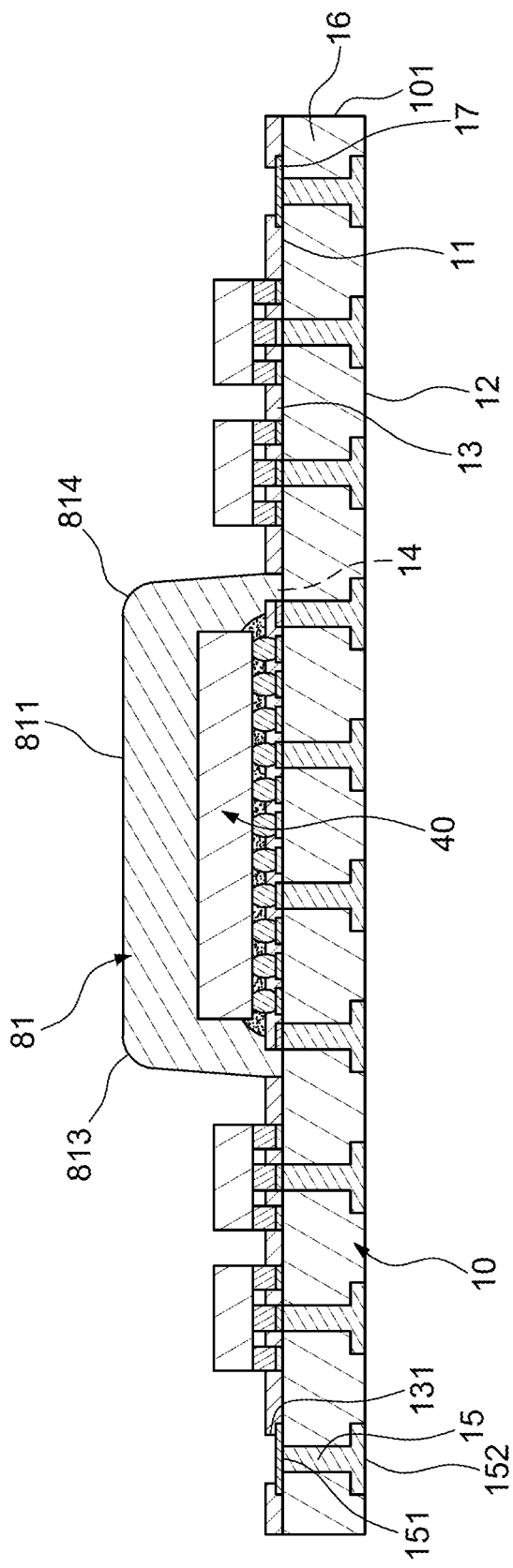
FIG. 15 illustrates one or more stages of an example of a method for manufacturing a semiconductor package structure according to some embodiments of the present disclosure.

Referring to FIG. 15, at least one cover material 81 is formed or disposed on the package substrate 10 to cover the semiconductor element 40. It is noted that the cover material 81 extends into and is bounded, at least in part, by the groove 14. The cover material 81 may be formed from a soluble material, a colloid material, a thermoset material, and/or a photoresist material. The cover material 81 may be formed in a manner including dispensing, coating, or spray finishing. Further, the cover material 81 may be formed in (e.g. from a top view) a straight line-shape, an L-shape, a T-shape, a Y-shape, a C-shape, a U-shape, an X-shape, or another shape.

In some embodiments, the cover material 81 may be a water glue. The water glue may be dissolvable in water. The material properties of the water glue may include a solubility rate of about 140 nm/s, a glass transition temperature (Tg) of about 90° C., a thermal expansion coefficient (CTE) of about 90 ppm and a film stress of about 0.6 MPa.

As shown in FIG. 15, the cover material 81 has a top surface 811, a first arc chamfer 813 and a second arc chamfer 814. The first arc chamfer 813 and the second arc chamfer 814 are located at two sides of top surface 811, respectively. The first arc chamfer 813 and the second arc chamfer 814 are formed due to the cohesion force of the cover material 81.

Figure 16:
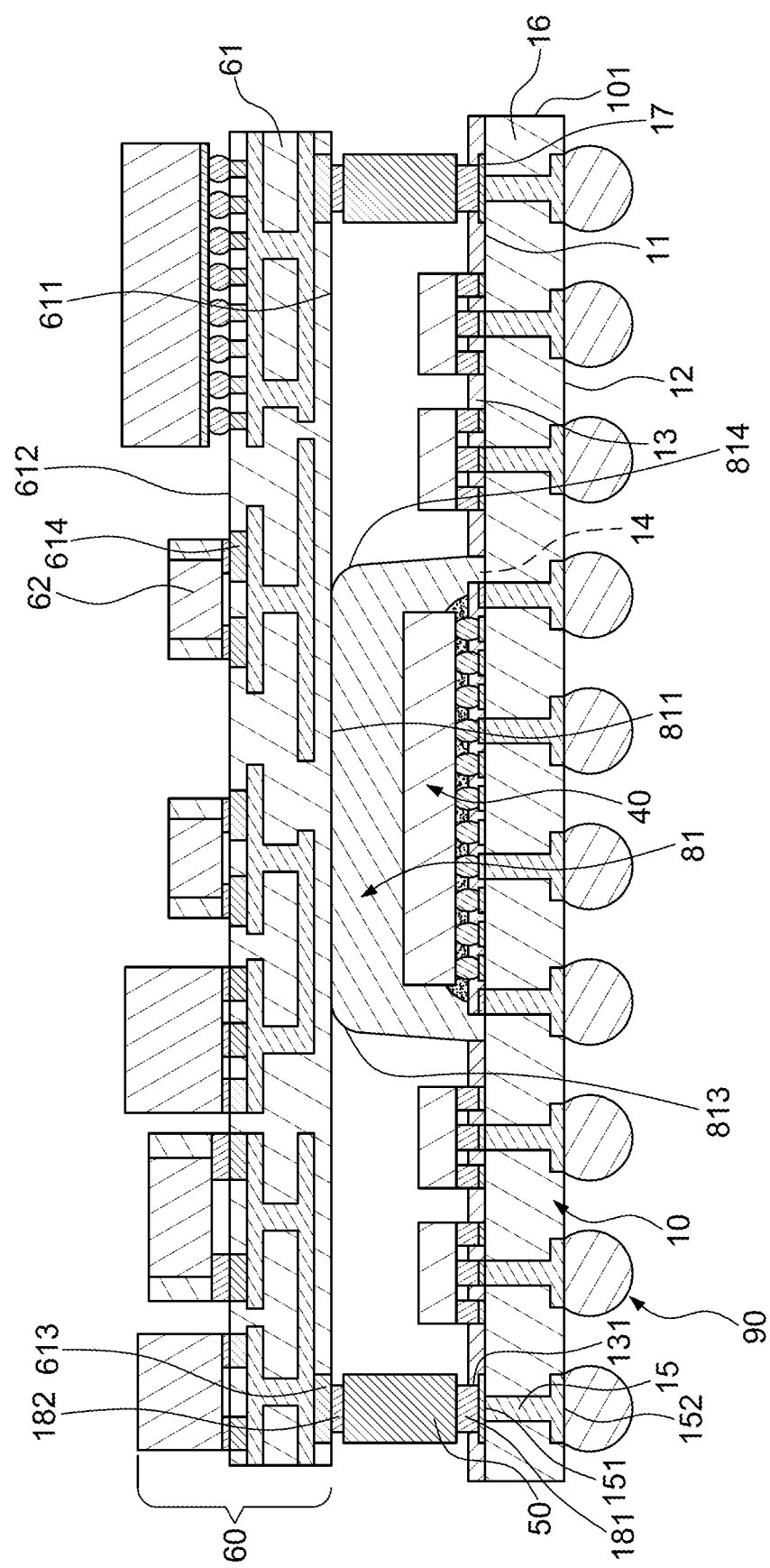
FIG. 16 illustrates one or more stages of an example of a method for manufacturing a semiconductor package structure according to some embodiments of the present disclosure.

Referring to FIG. 16, at least one interposer 50 is disposed on and electrically connected to the package substrate 10. At least one assembly module 60 is disposed on and electrically connected to the interposer 50 and above the cover material 81.

The interposer 50 may be, for example, a substrate interposer, a silicon interposer, a through-silicon via (TSV) interposer, a printed-circuit board, a high-density interconnect, or the like. In some embodiments, the interposer 50 is disposed on and electrically connected to the exposed portion of the circuit layer 17 through at least one solder bump 181.

The assembly module 60 includes a module substrate 61 disposed on and electrically connected to the interposer 50 and at least one electronic component 62 disposed on and electrically connected to the module substrate 61. The module substrate 61 includes a bottom surface 611 facing the interposer 50, a top surface 612 opposite to the bottom surface 611, a plurality of first bonding pads 613 exposed from the bottom surface 611 and a plurality of second bonding pads 614 exposed from the top surface 612. In some embodiments, the first bonding pads 613 of the module substrate 61 may be electrically connected to the interposer 50 through a plurality of solder bumps 182. The electronic component 62 may be electrically connected to the second bonding pads 614. A portion of the bottom surface 611 of the module substrate 61 may contact the top surface 811 of the cover material 81.

Figure 17:
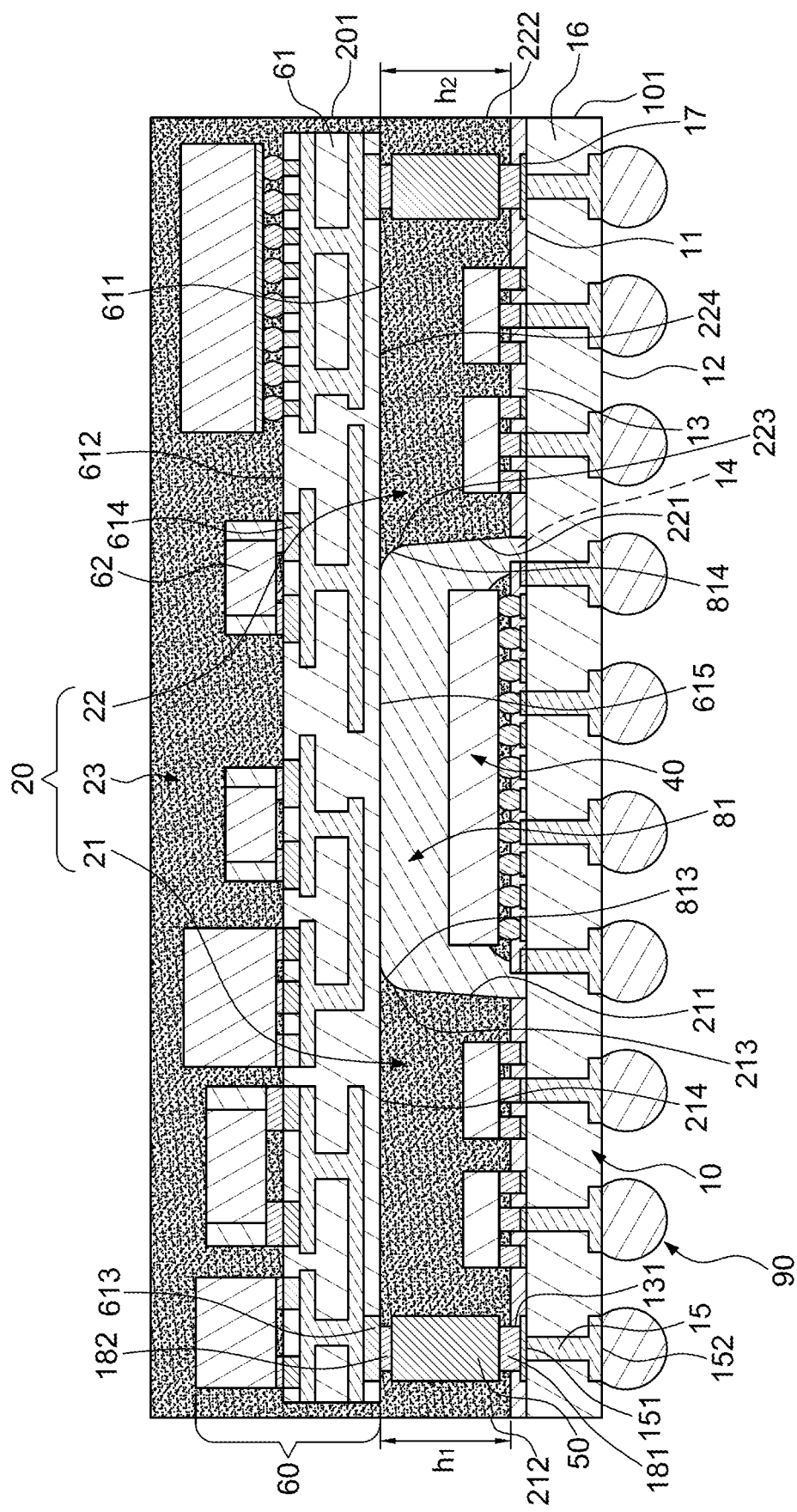
FIG. 17 illustrates one or more stages of an example of a method for manufacturing a semiconductor package structure according to some embodiments of the present disclosure.
Figure 18:
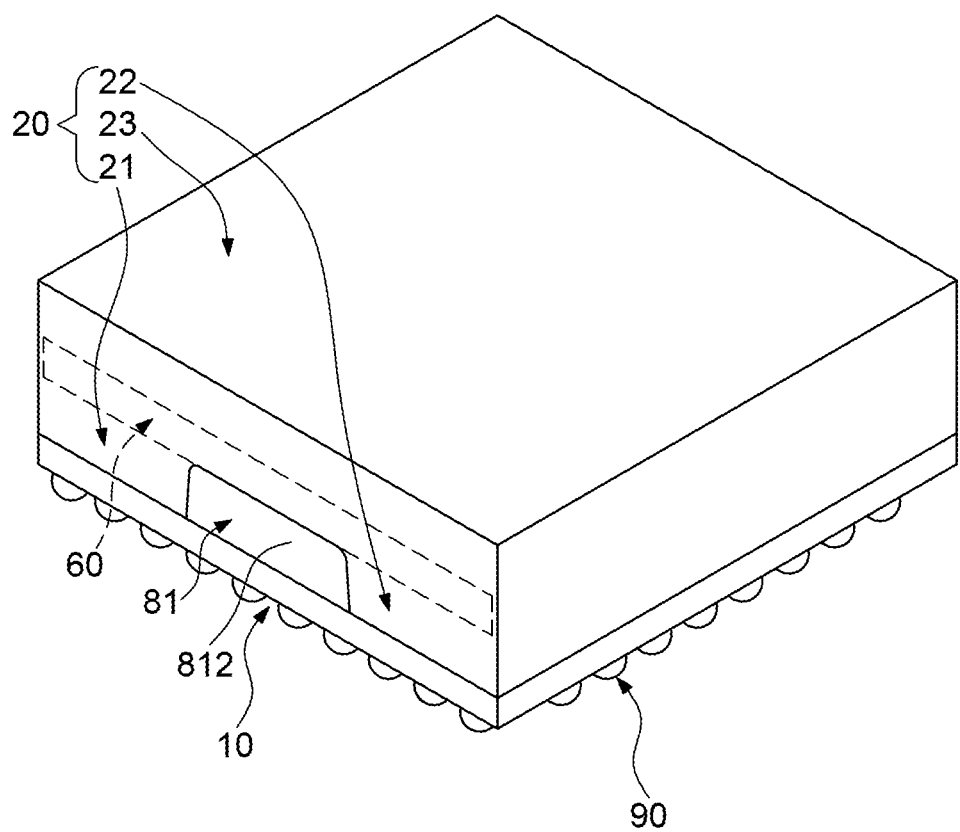
FIG. 18 illustrates one or more stages of an example of a method for manufacturing a semiconductor package structure according to some embodiments of the present disclosure.

Referring to FIG. 17 and FIG. 18, an encapsulant 20 is formed or disposed on the package substrate 10 to cover the cover material 81, the interposer 50 and the assembly module 60. A material of the encapsulant 20 may be a molding compound with or without fillers. It is noted that at least one end surface 812 (shown in FIG. 18) of the cover material 81 is exposed from the encapsulant 20.

The encapsulant 20 includes a first encapsulant portion 21, a second encapsulant portion 22 spaced apart from the first encapsulant portion 21 and a third encapsulant portion 23 above the first encapsulant portion 21 and the second encapsulant portion 22. The first encapsulant portion 21, the second encapsulant portion 22 and the third encapsulant portion 23 are formed concurrently, and are formed as a monolithic structure. A peripheral surface 101 of the package substrate 10 is substantially coplanar with a peripheral surface 201 of the encapsulant 20.

The first encapsulant portion 21 and the second encapsulant portion 22 cover the cover material 81, the interposer 50 and the insulation layer 13 of the package substrate 10. The first encapsulant portion 21 and the second encapsulant portion 22 contact and cover a portion of the bottom surface 611 of the module substrate 61. The module substrate 61 may include a bottom exposed area 615 (e.g. a portion of the bottom surface 611 that is not covered by the first encapsulant portion 21 and is not covered by the second encapsulant portion 22) that is exposed from the encapsulant 20. The cover material 81 contacts and covers the bottom exposed area 615.

The first encapsulant portion 21 includes a respective inner lateral surface 211 that contacts the cover material 81, a respective outer lateral surface 212 opposite to the respective inner lateral surface 211, an arc chamfer portion 213 extending from, or constituting one end of, the respective inner lateral surface 211 and a respective upper surface 214 extended between the respective inner lateral surface 211 and the respective outer lateral surface 212. The second encapsulant portion 22 includes a respective inner lateral surface 221 that contacts the cover material 81, a respective outer lateral surface 222 opposite to the respective inner lateral surface 221, an arc chamfer portion 223 extending from, or constituting one end of, the respective inner lateral surface 221 and a respective upper surface 224 extended between the respective inner lateral surface 221 and the respective outer lateral surface 222. Since the first encapsulant portion 21 covers the first arc chamfers 813 of the cover material 81 and the second encapsulant portion 22 covers the second arc chamfers 814 of the cover material 81, the arc chamfer portion 213 and the arc chamfer portion 223 may be conformal with the first arc chamfers 813 and the second arc chamfers 814, respectively.

The third encapsulant portion 23 covers the assembly module 60. The third encapsulant portion 23 is connected to the first encapsulant portion 21 and the second encapsulant portion 22.

As shown in FIG. 17 and FIG. 18, a plurality of solder bumps 90 are mounted on the package substrate 10 after the encapsulant 20 is formed. Then, the encapsulant 20, the assembly module 60, the cover material 81 and the package substrate 10 may be sawed to expose the end surface 812 of the cover material 81.

Then, the cover material 81 is removed to form at least one passage 30, and the semiconductor element 40 is exposed in the passage 30, so as to obtain the semiconductor package structure 1 of FIG. 1 and FIG. 2. The cover material 81 may be removed by water, solvent, or vaporization. The passage 30 is formed between the first encapsulant portion 21 and the second encapsulant portion 22. That is, the passage 30 is defined by the first encapsulant portion 21 and the second encapsulant portion 22. A height h of the passage 30 is about equal to a height h1 of the first encapsulant portion 21 or a height h2 of the second encapsulant portion 22. The passage 30 is also formed between the package substrate 10 and the assembly module 60. Thus, the passage 30 is further defined by the package substrate 10 and the assembly module 60.

Figure 19:
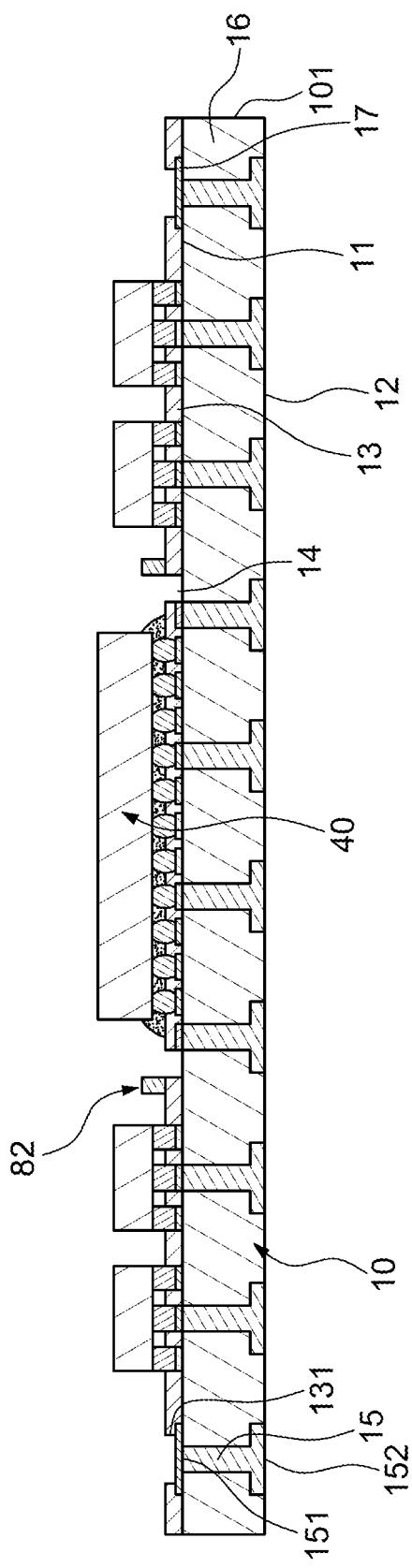
FIG. 19 illustrates one or more stages of an example of a method for manufacturing a semiconductor package structure according to some embodiments of the present disclosure.

FIG. 19 through FIG. 24 illustrate a method for manufacturing a semiconductor package structure according to some embodiments of the present disclosure. In some embodiments, the method is for manufacturing a semiconductor package structure such as the semiconductor package structure 1j shown in FIG. 13. The initial stage of the illustrated process is the same as, or similar to, the stage illustrated in FIG. 14. FIG. 19 depicts a stage subsequent to that depicted in FIG. 14.

Referring to FIG. 19, at least one dam 82 is formed or disposed on the insulation layer 13 to surround the groove 14.

Figure 20:
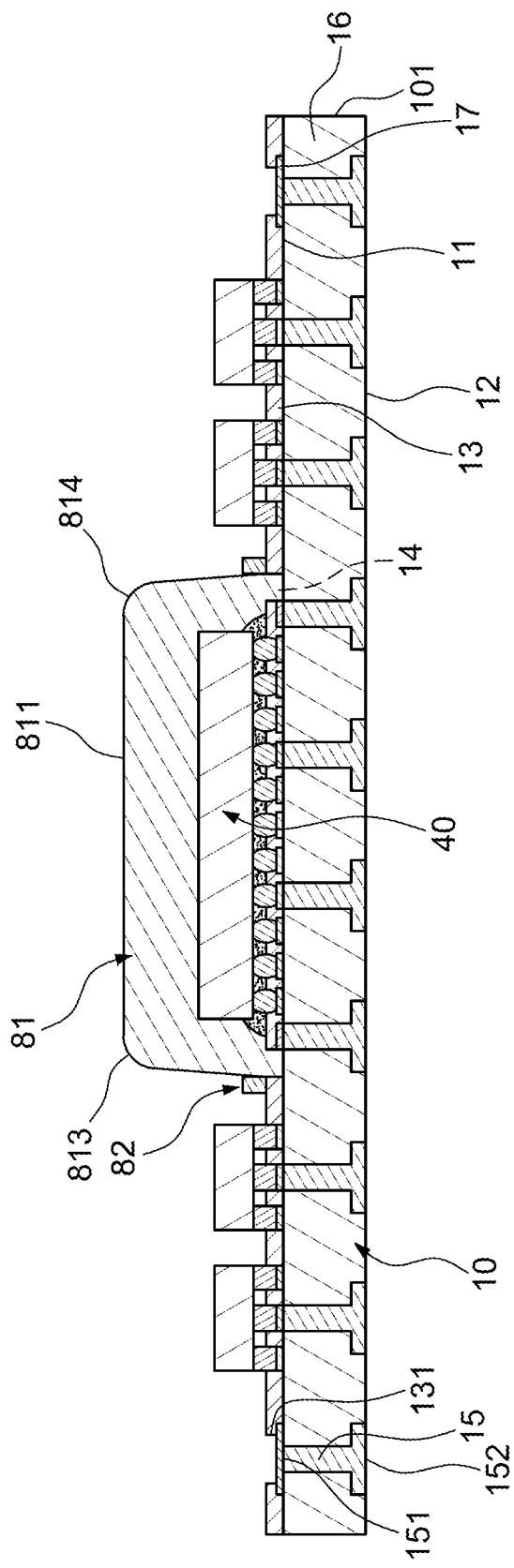
FIG. 20 illustrates one or more stages of an example of a method for manufacturing a semiconductor package structure according to some embodiments of the present disclosure.

Referring to FIG. 20, at least one cover material 81 is formed or disposed on the package substrate 10 to cover the semiconductor element 40. The cover material 81 may be the same as the cover material 81 of FIG. 15. As shown in FIG. 20, the cover material 81 is formed in the dam 82 and extends into the groove 14. The cover material 81 is bounded by the dam 82, and thus the dam may help to improve the shape of the cover material 81 (and thereby improve the shape of the passage 30).

Figure 21:
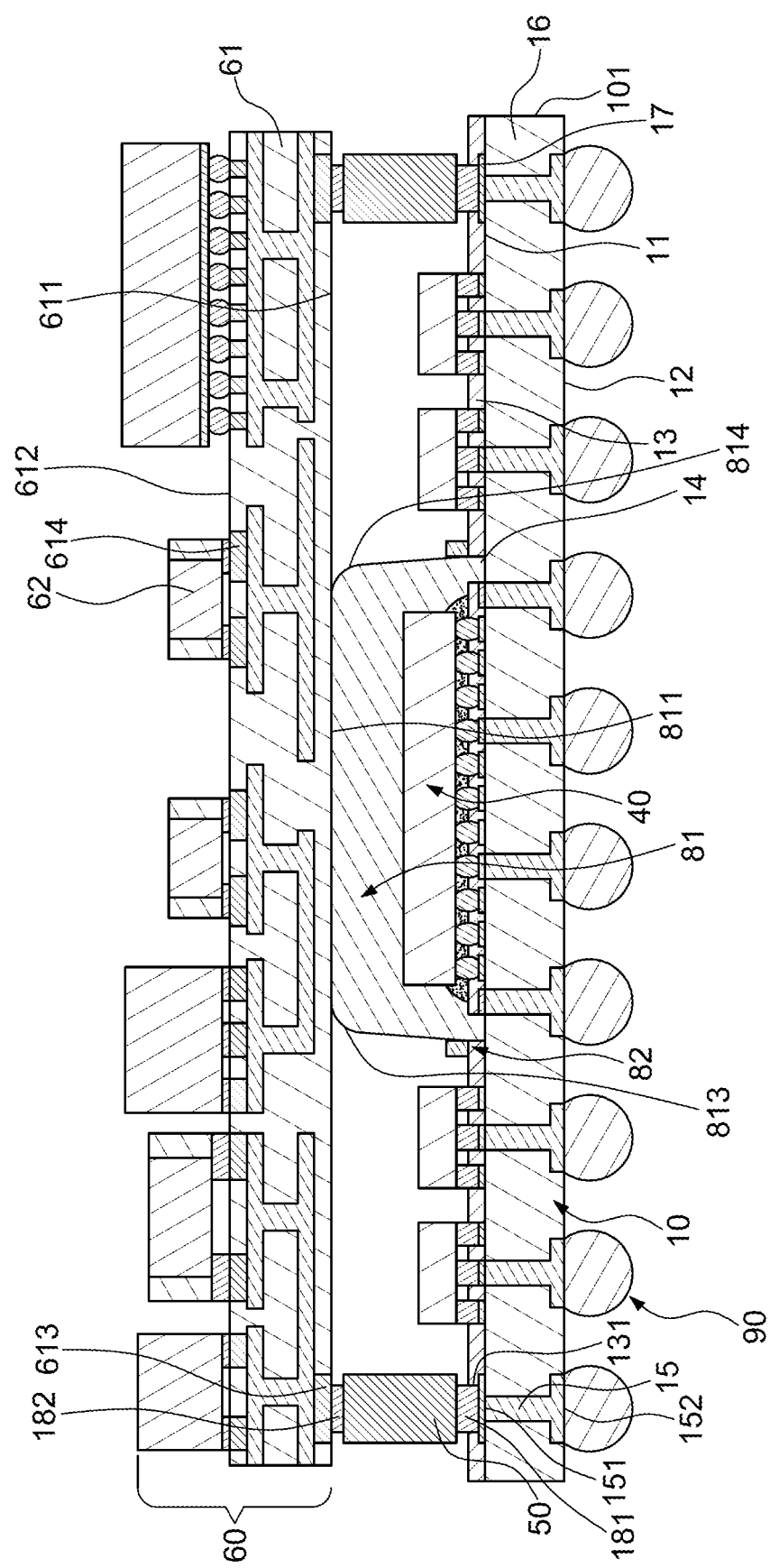
FIG. 21 illustrates one or more stages of an example of a method for manufacturing a semiconductor package structure according to some embodiments of the present disclosure.

Referring to FIG. 21, at least one interposer 50 is disposed on and electrically connected to the package substrate 10. Then, at least one assembly module 60 is disposed on and electrically connected to the interposer 50 and above the cover material 81. The interposer 50 and the assembly module 60 of FIG. 21 may be the same as the interposer 50 and the assembly module 60 of FIG. 16.

Figure 22:
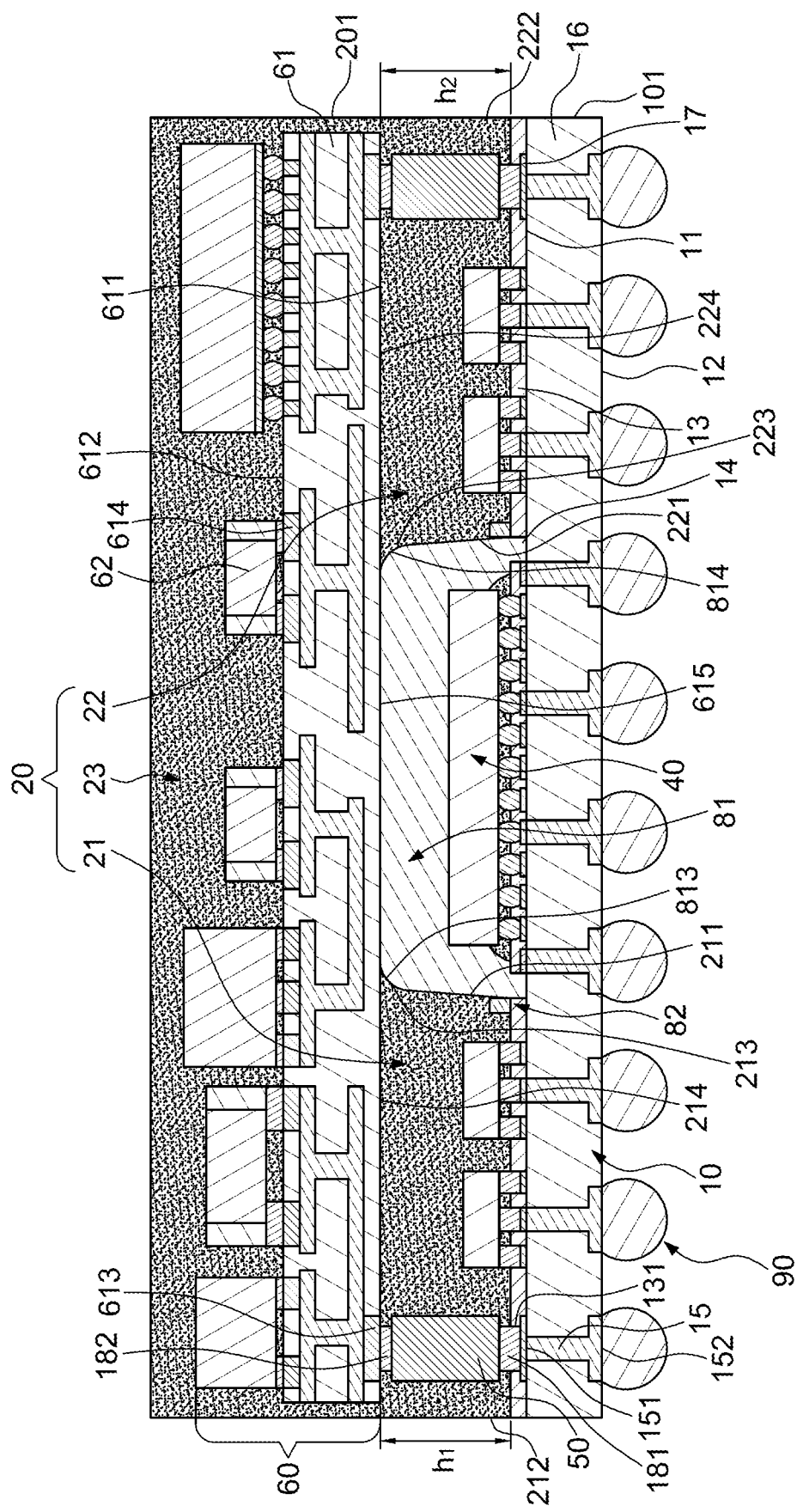
FIG. 22 illustrates one or more stages of an example of a method for manufacturing a semiconductor package structure according to some embodiments of the present disclosure.
Figure 23:
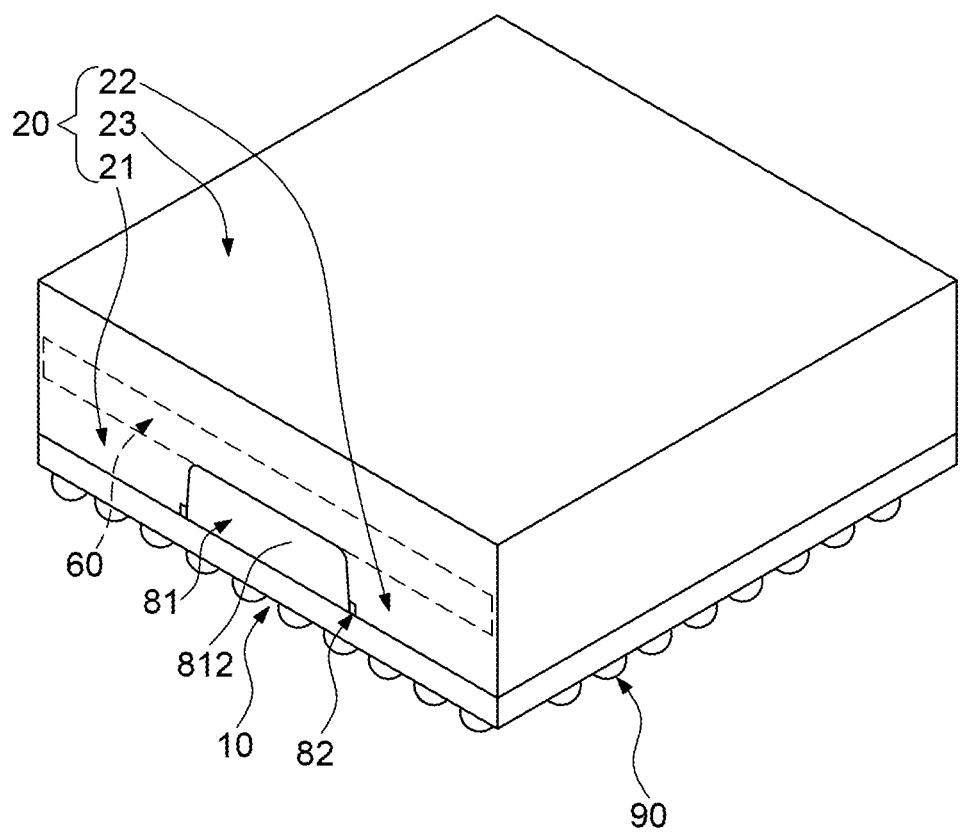
FIG. 23 illustrates one or more stages of an example of a method for manufacturing a semiconductor package structure according to some embodiments of the present disclosure.

Referring to FIG. 22 and FIG. 23, an encapsulant 20 is formed or disposed on the package substrate 10 to cover the cover material 81, the dam 82, the interposer 50 and the assembly module 60. The encapsulant 20 of FIG. 22 and FIG. 23 may be the same as the encapsulant 20 of FIG. 17 and FIG. 18.

Figure 24:
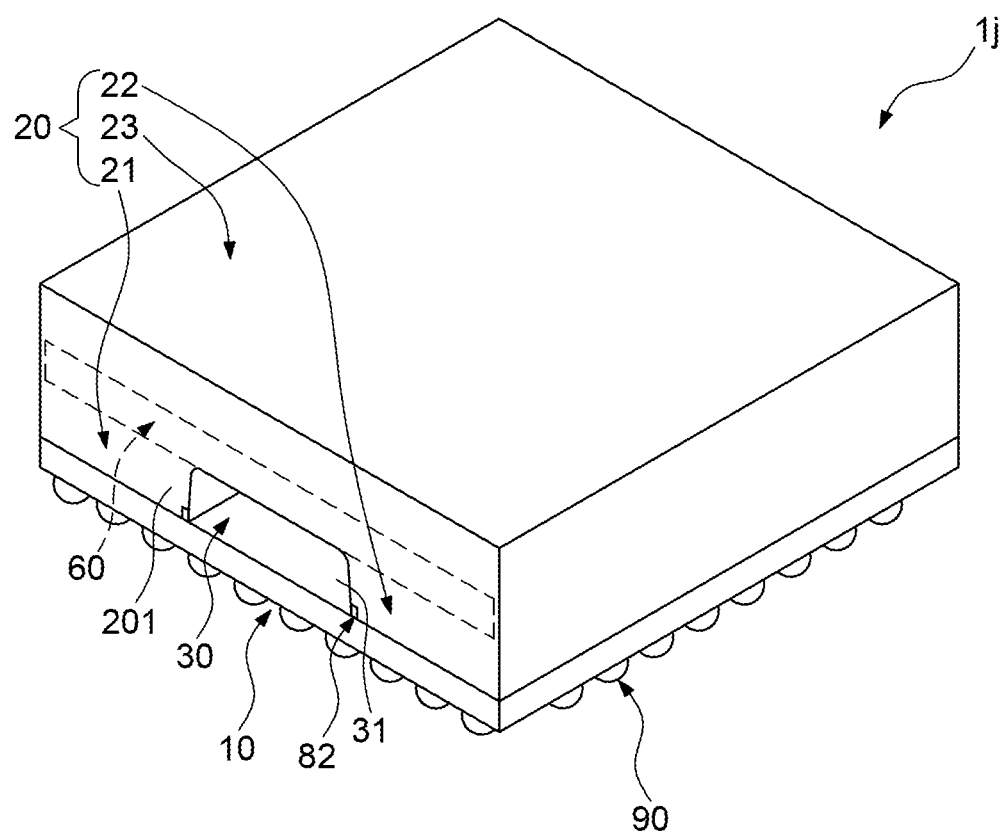
FIG. 24 illustrates one or more stages of an example of a method for manufacturing a semiconductor package structure according to some embodiments of the present disclosure.

Referring to FIG. 23 and FIG. 24, the cover material 81 is removed to form at least one passage 30, and the semiconductor element 40 is exposed in the passage 30, so as to obtain the semiconductor package structure 1j of FIG. 13. In some embodiments, the dam 82 is removed (e.g. along with the cover material 81). The dam may comprise a same or similar material as the cover material 81, and thus may be removed in a same process as the cover material 81.

Figure 25:
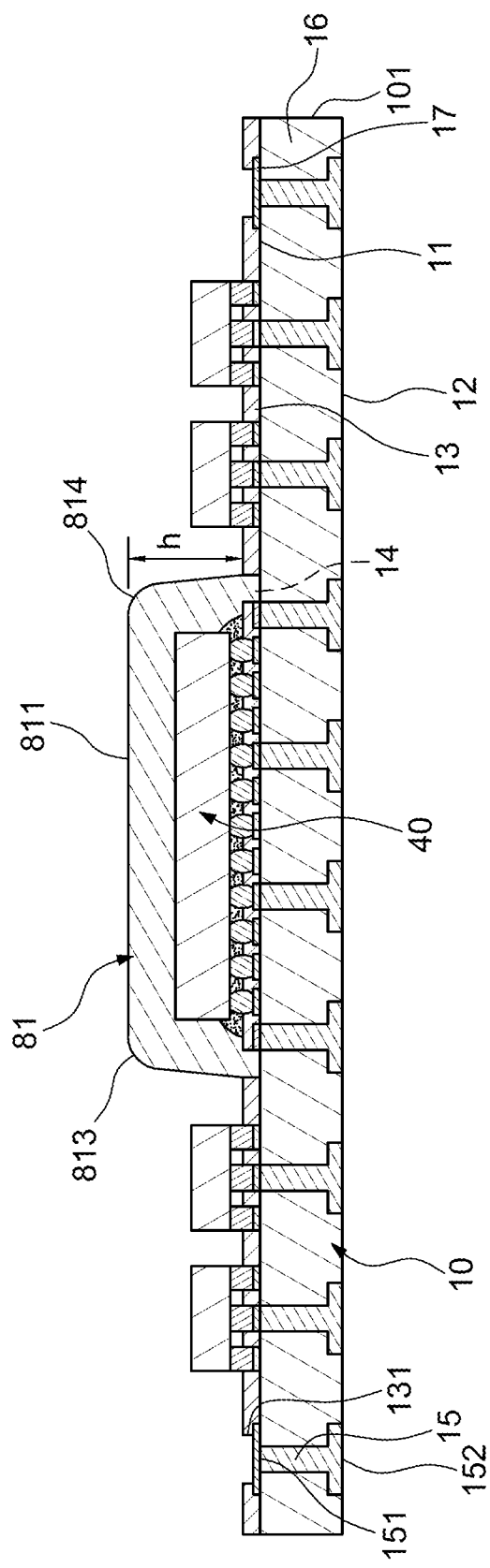
FIG. 25 illustrates one or more stages of an example of a method for manufacturing a semiconductor package structure according to some embodiments of the present disclosure.

FIG. 25 through FIG. 28 illustrate a method for manufacturing a semiconductor package structure according to some embodiments of the present disclosure. In some embodiments, the method is for manufacturing a semiconductor package structure such as the semiconductor package structure 1a shown in FIG. 4. The initial stage of the illustrated process is the same as, or similar to, the stage illustrated in FIG. 14. FIG. 25 depicts a stage subsequent to that depicted in FIG. 14.

Referring to FIG. 25, at least one cover material 81 is formed or disposed on the package substrate 10 to cover the semiconductor element 40. The cover material 81 is similar to the cover material 81 of FIG. 15, except that the height h of the cover material 81 is reduced (e.g., by a factor of about 0.9 or less, a factor of about 0.8 or less, or a factor of about 0.7 or less).

Figure 26:
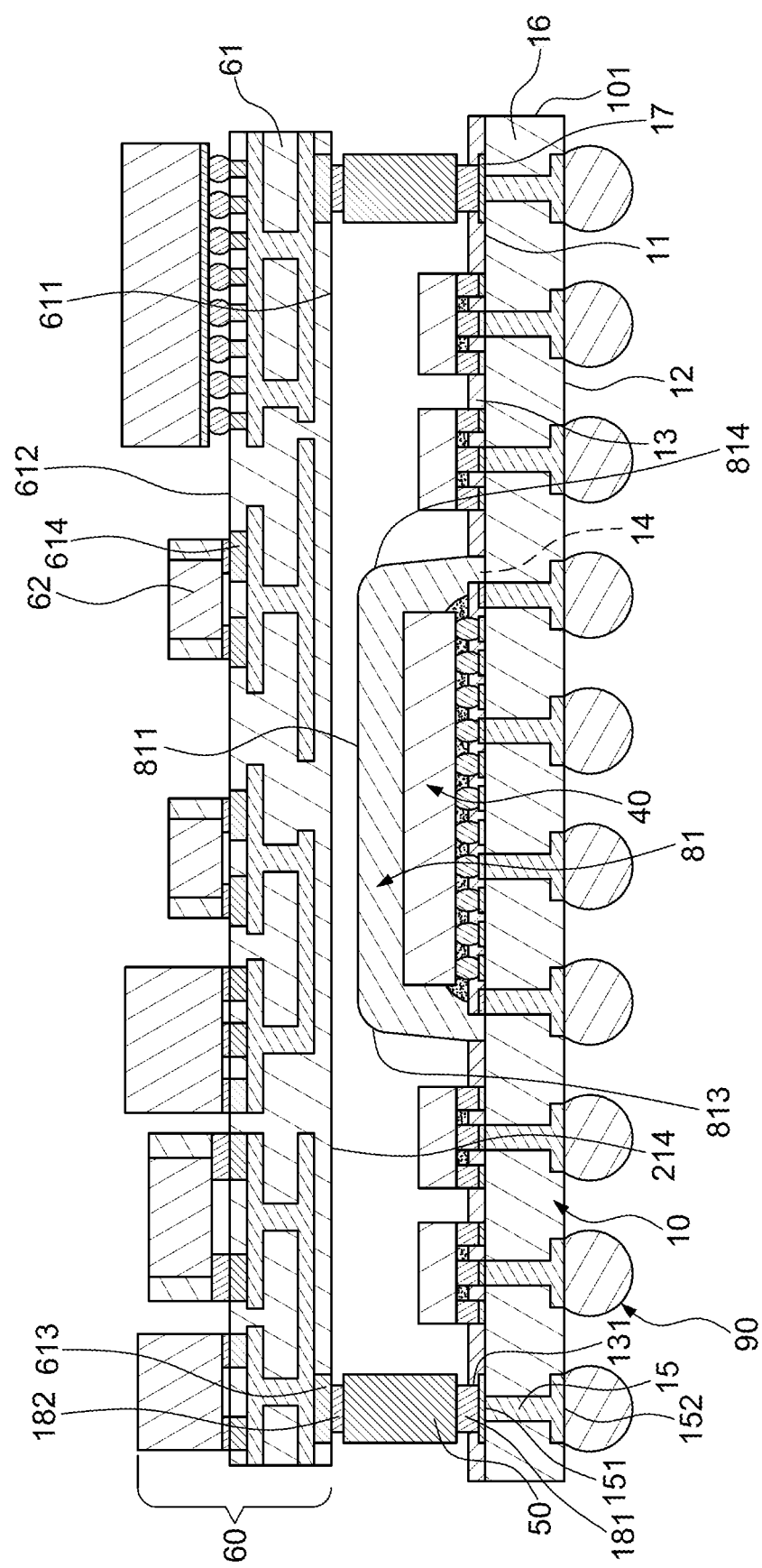
FIG. 26 illustrates one or more stages of an example of a method for manufacturing a semiconductor package structure according to some embodiments of the present disclosure.

Referring to FIG. 26, at least one interposer 50 is disposed on and electrically connected to the package substrate 10. Then, at least one assembly module 60 is disposed on and electrically connected to the interposer 50 and above the cover material 81. The interposer 50 and the assembly module 60 of FIG. 26 may be the same as the interposer 50 and the assembly module 60 of FIG. 16.

As shown in FIG. 26, the cover material 81 does not contact and cover the bottom surface 611 of the module substrate 61, and there is a gap between the top surface 811 of the cover material 81 and the bottom surface 611 of the module substrate 61.

Figure 27:
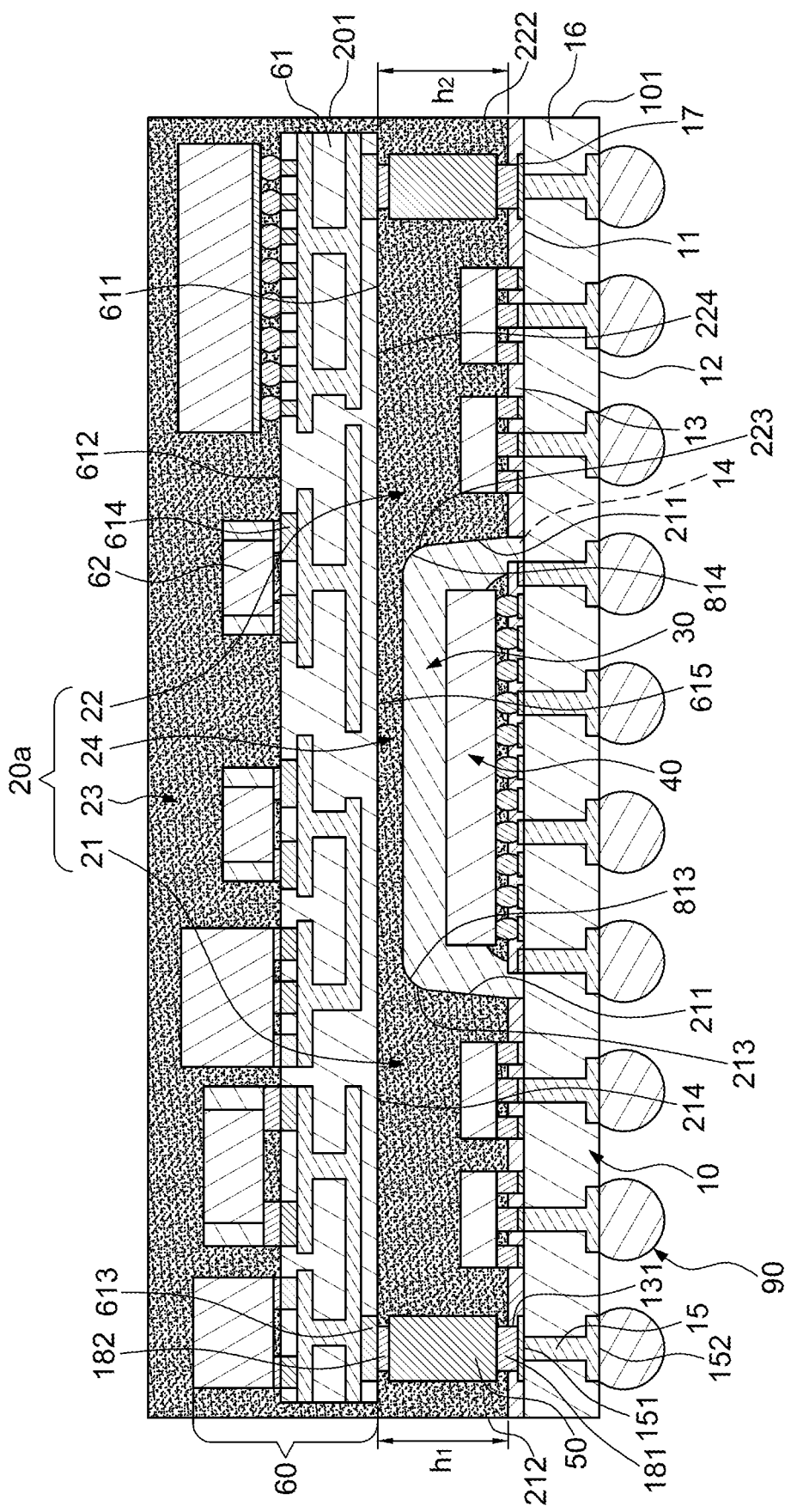
FIG. 27 illustrates one or more stages of an example of a method for manufacturing a semiconductor package structure according to some embodiments of the present disclosure.
Figure 28:
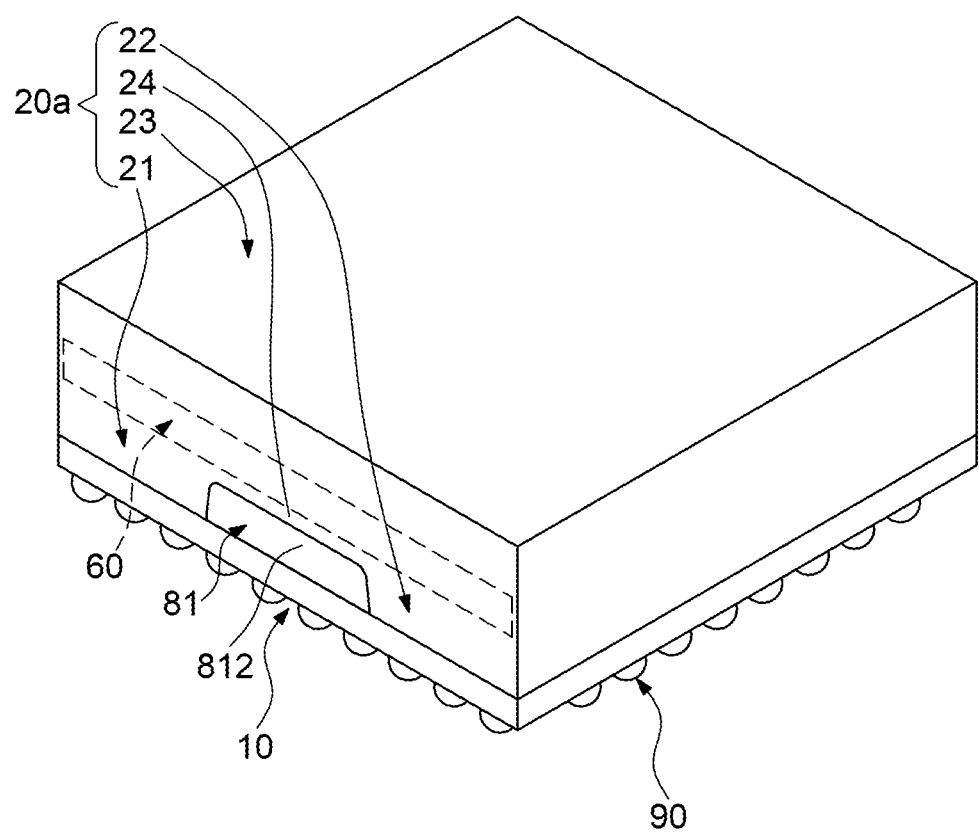
FIG. 28 illustrates one or more stages of an example of a method for manufacturing a semiconductor package structure according to some embodiments of the present disclosure.

Referring to FIG. 27 and FIG. 28, an encapsulant 20a is formed or disposed on the package substrate 10 to cover the cover material 81, the interposer 50 and the assembly module 60. The encapsulant 20a of FIG. 27 and FIG. 28 is similar to the encapsulant 20 of FIG. 17 and FIG. 18, except that the encapsulant 20a further includes a bridge encapsulant portion 24 located above the cover material 81 and connected to the first encapsulant portion 21 and the second encapsulant portion 22.

Then, the cover material 81 is removed to form at least one passage 30, so as to obtain the semiconductor package structure 1a of FIG. 4 and FIG. 5.

Figure 29:
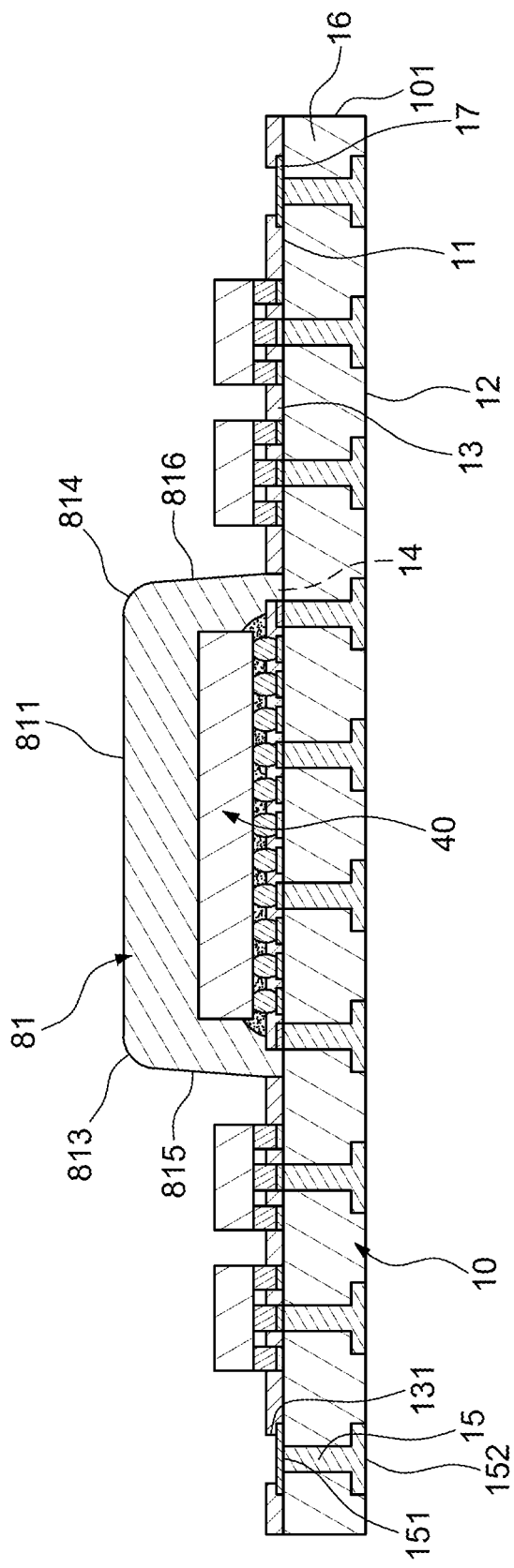
FIG. 29 illustrates one or more stages of an example of a method for manufacturing a semiconductor package structure according to some embodiments of the present disclosure.

FIG. 29 through FIG. 33 illustrate a method for manufacturing a semiconductor package structure according to some embodiments of the present disclosure. In some embodiments, the method is for manufacturing a semiconductor package structure such as the semiconductor package structure 1b shown in FIG. 6. The initial stage of the illustrated process is the same as, or similar to, the stage illustrated in FIG. 14. FIG. 29 depicts a stage subsequent to that depicted in FIG. 14.

Referring to FIG. 29, at least one cover material 81 is formed or disposed on the package substrate 10 to cover the semiconductor element 40. The cover material 81 may be the same as the cover material 81 of FIG. 15.

Figure 30:
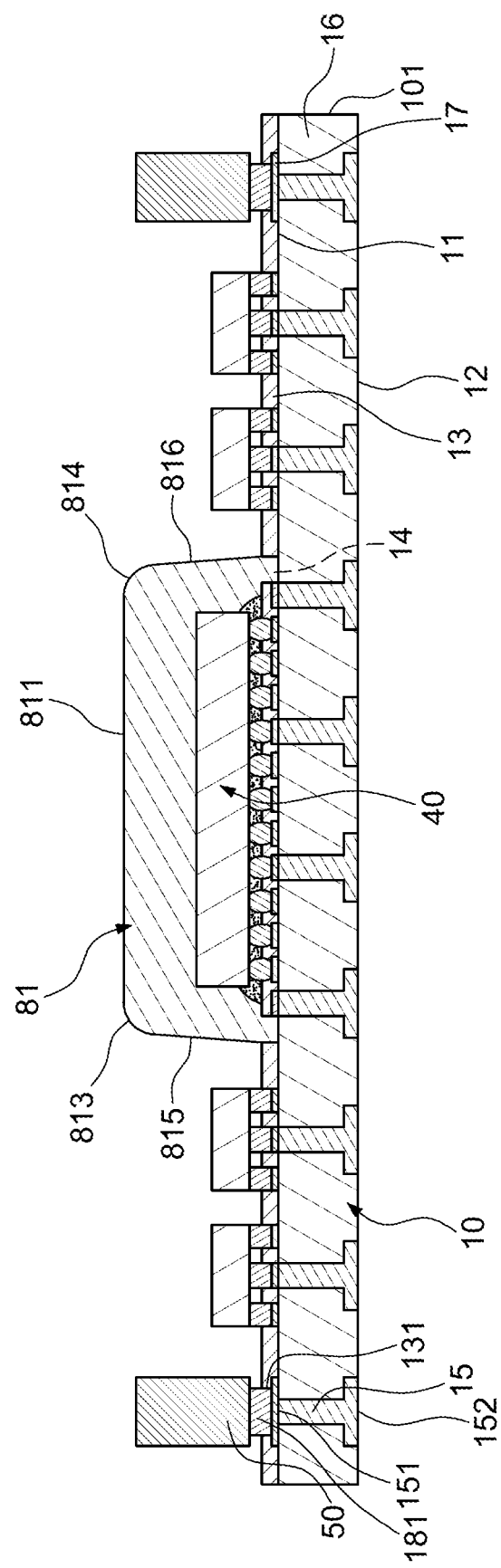
FIG. 30 illustrates one or more stages of an example of a method for manufacturing a semiconductor package structure according to some embodiments of the present disclosure.

Referring to FIG. 30, at least one interposer 50 is disposed on and electrically connected to the package substrate 10. The interposer 50 of FIG. 30 may be the same as the interposer 50 of FIG. 16.

Figure 31:
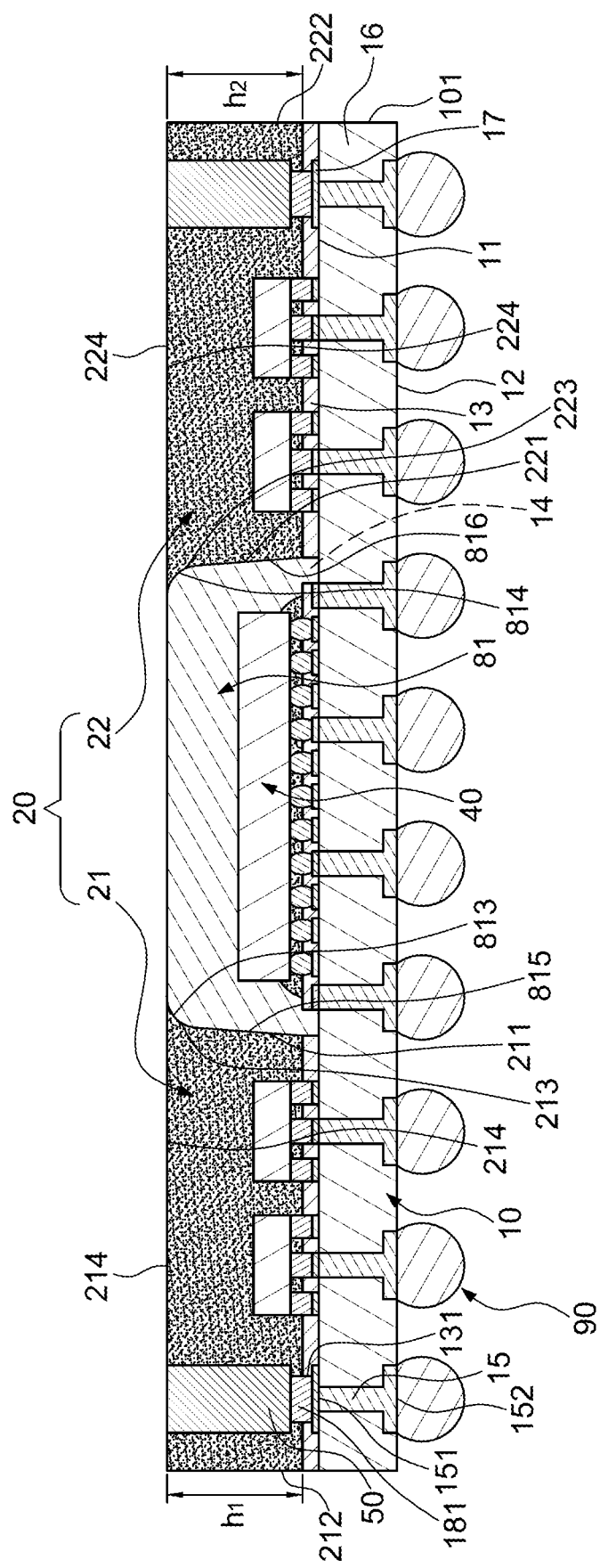
FIG. 31 illustrates one or more stages of an example of a method for manufacturing a semiconductor package structure according to some embodiments of the present disclosure.
Figure 32:
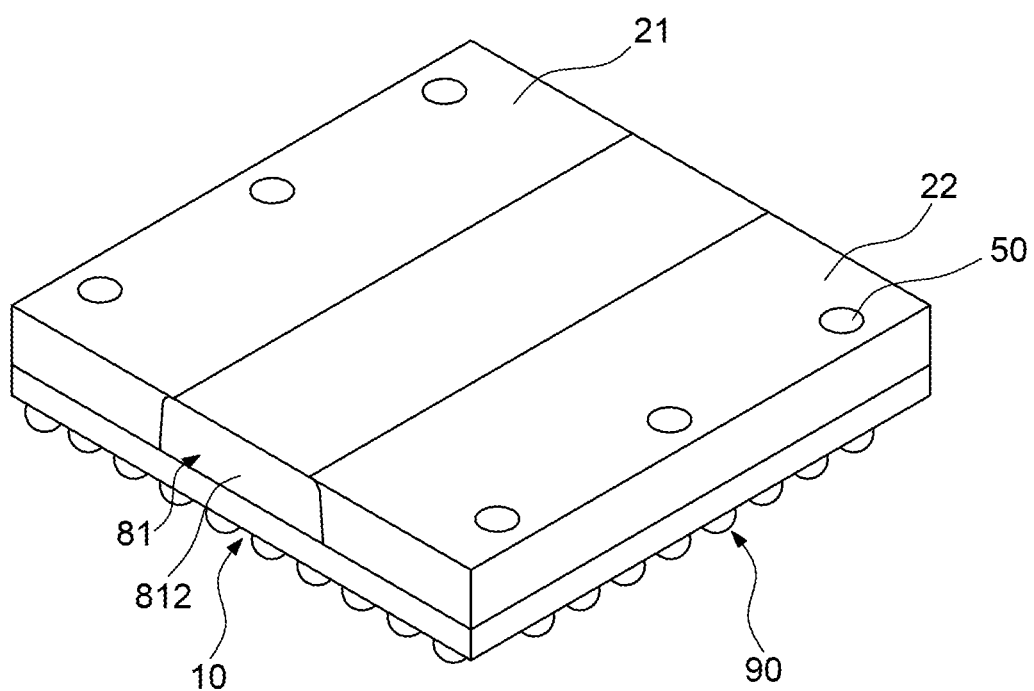
FIG. 32 illustrates one or more stages of an example of a method for manufacturing a semiconductor package structure according to some embodiments of the present disclosure.

Referring to FIG. 31 and FIG. 32, an encapsulant 20 is formed or disposed on the package substrate 10 to cover the cover material 81 and the interposer 50. The encapsulant 20 of FIG. 31 and FIG. 32 is similar to the encapsulant 20 of FIG. 17 and FIG. 18, except that the third encapsulant portion 23 of the encapsulant 20 is omitted. The first encapsulant portion 21 covers a first lateral surface 815 and the first arc chamfer 813 of the cover material 81. The second encapsulant portion 22 covers a second lateral surface 816 and the second arc chamfer 814 of the cover material 81. A portion of the interposer 50 may be exposed from the respective upper surface 214 of first encapsulant portion 21 and the respective upper surface 224 of the second encapsulant portion 22 for external connection.

Figure 33:
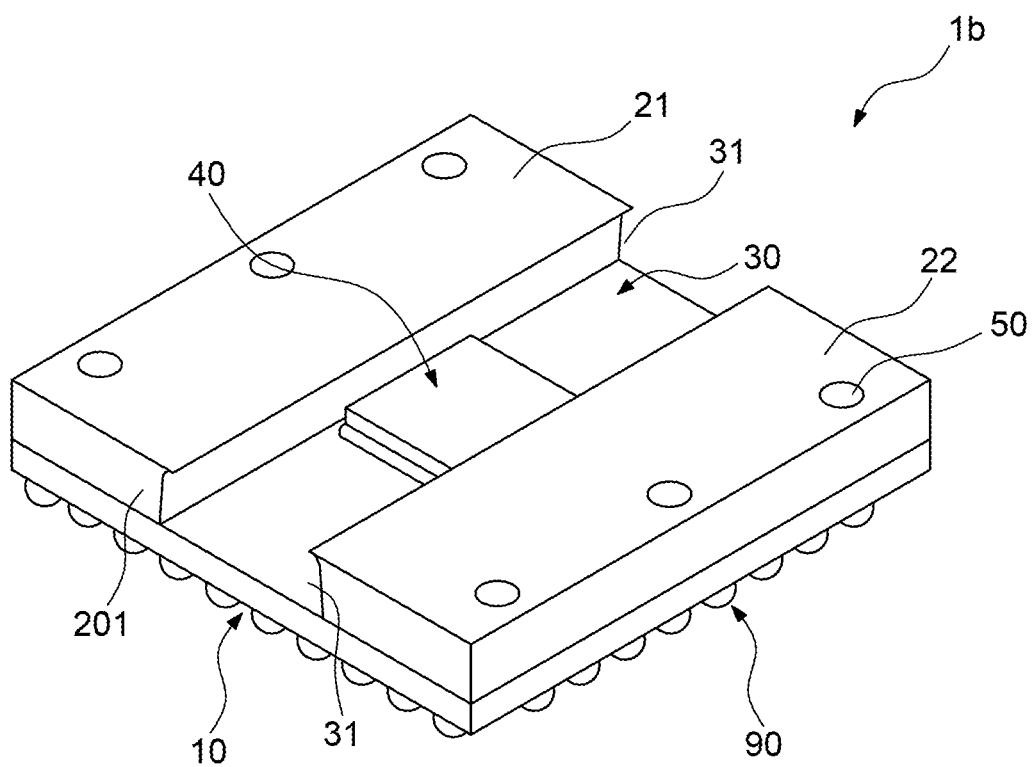
FIG. 33 illustrates one or more stages of an example of a method for manufacturing a semiconductor package structure according to some embodiments of the present disclosure.

Referring to FIG. 32 and FIG. 33, the cover material 81 is removed to form at least one passage 30, so as to obtain the semiconductor package structure 1b of FIG. 6.

Figure 34:
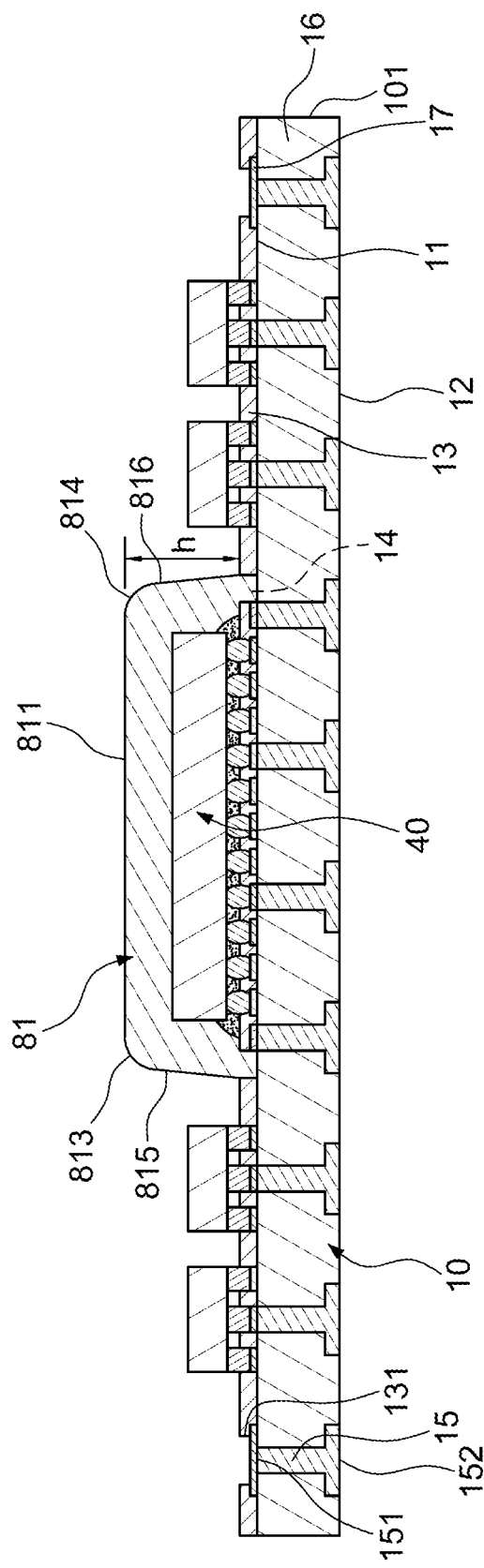
FIG. 34 illustrates one or more stages of an example of a method for manufacturing a semiconductor package structure according to some embodiments of the present disclosure.

FIG. 34 through FIG. 38 illustrate a method for manufacturing a semiconductor package structure 1c according to some embodiments of the present disclosure. In some embodiments, the method is for manufacturing a semiconductor package structure such as the semiconductor package structure 1c shown in FIG. 7. The initial stage of the illustrated process is the same as, or similar to, the stage illustrated in FIG. 14. FIG. 34 depicts a stage subsequent to that depicted in FIG. 14.

Referring to FIG. 34, at least one cover material 81 is formed or disposed on the package substrate 10 to cover the semiconductor element 40. The cover material 81 is similar to the cover material 81 of FIG. 15, except that the height h of the cover material 81 is reduced (e.g., by a factor of about 0.9 or less, by a factor of about 0.8 or less, or by a factor of about 0.7 or less).

Figure 35:
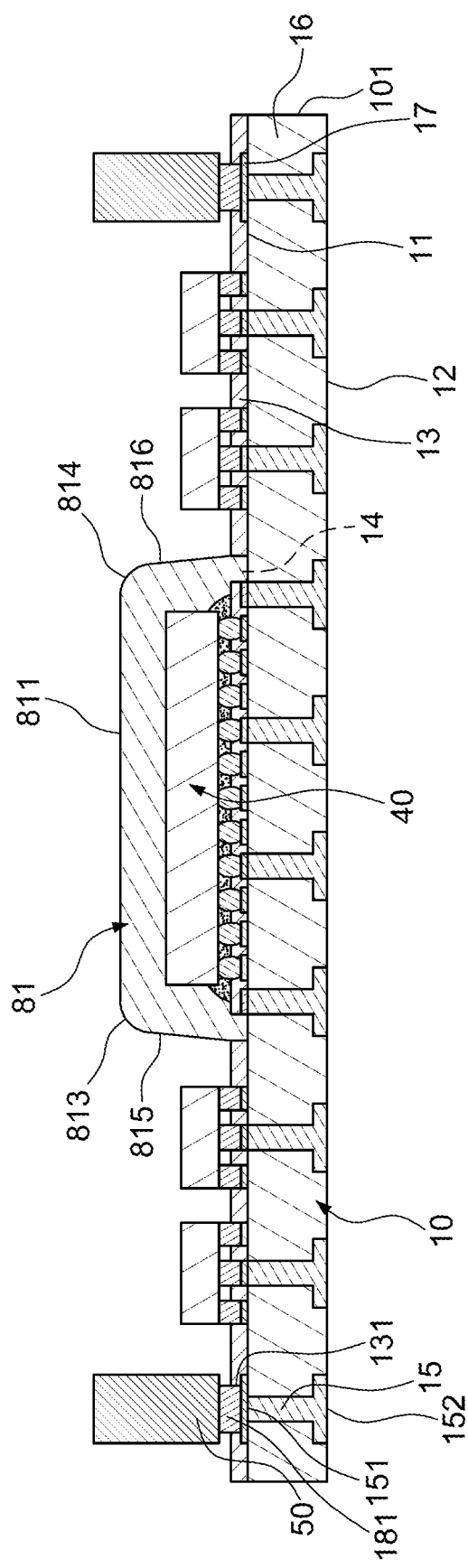
FIG. 35 illustrates one or more stages of an example of a method for manufacturing a semiconductor package structure according to some embodiments of the present disclosure.

Referring to FIG. 35, at least one interposer 50 is disposed on and electrically connected to the package substrate 10. The interposer 50 of FIG. 35 may be the same as the interposer 50 of FIG. 16.

Figure 36:
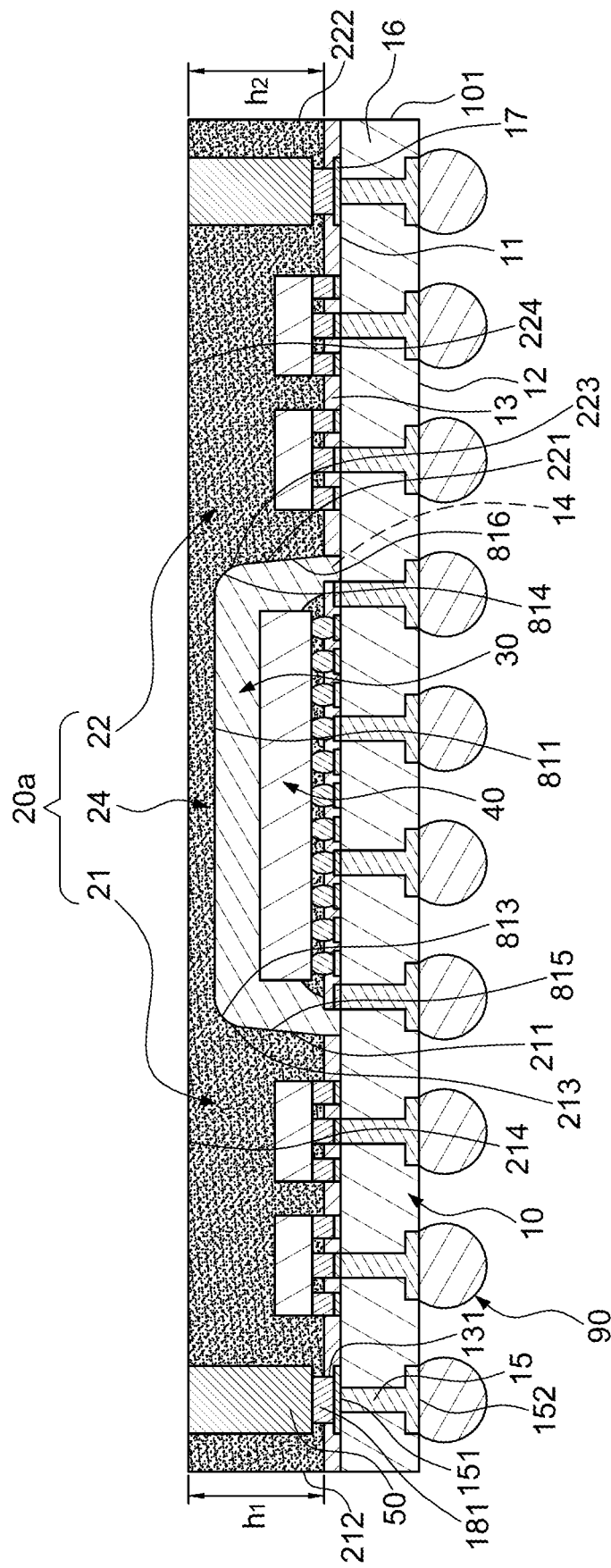
FIG. 36 illustrates one or more stages of an example of a method for manufacturing a semiconductor package structure according to some embodiments of the present disclosure.
Figure 37:
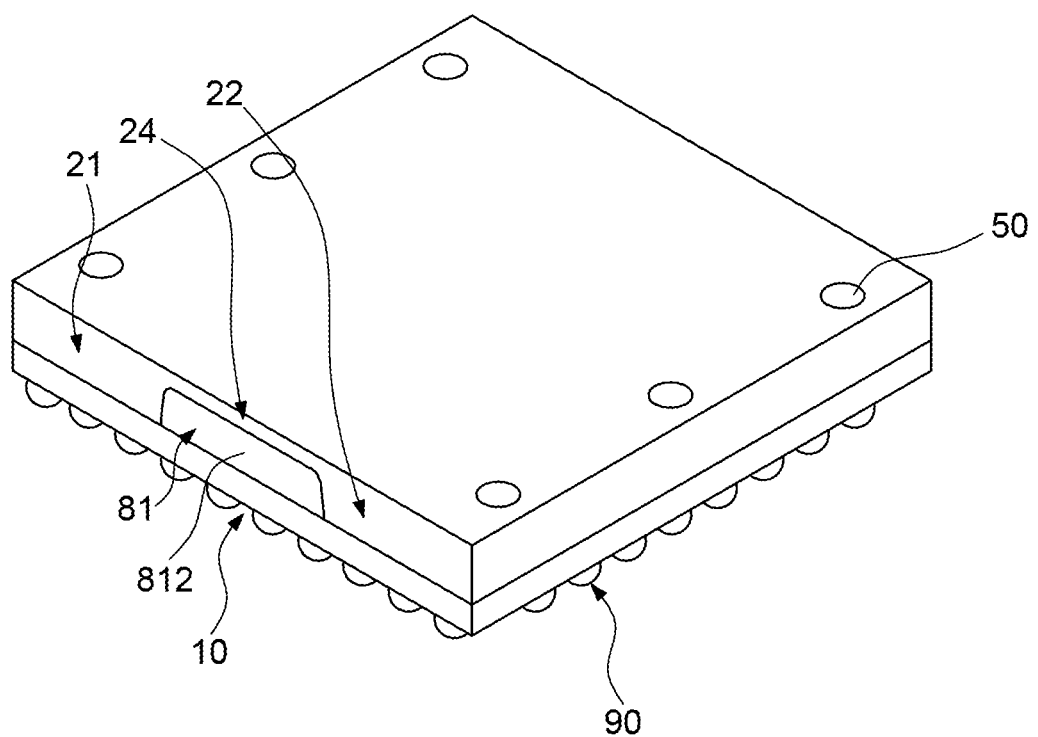
FIG. 37 illustrates one or more stages of an example of a method for manufacturing a semiconductor package structure according to some embodiments of the present disclosure.

Referring to FIG. 36 and FIG. 37, an encapsulant 20a is formed or disposed on the package substrate 10 to cover the cover material 81 and the interposer 50. The encapsulant 20a of FIG. 36 and FIG. 37 is similar to the encapsulant 20a of FIG. 27 and FIG. 28, except that the third encapsulant portion 23 of the encapsulant 20a is omitted. The first encapsulant portion 21 covers a first lateral surface 815 and the first arc chamfer 813 of the cover material 81. The second encapsulant portion 22 covers a second lateral surface 816 and the second arc chamfer 814 of the cover material 81. A portion of the interposer 50 may be exposed from the respective upper surface 214 of first encapsulant portion 21 and the respective upper surface 224 of the second encapsulant portion 22 for external connection.

Figure 38:
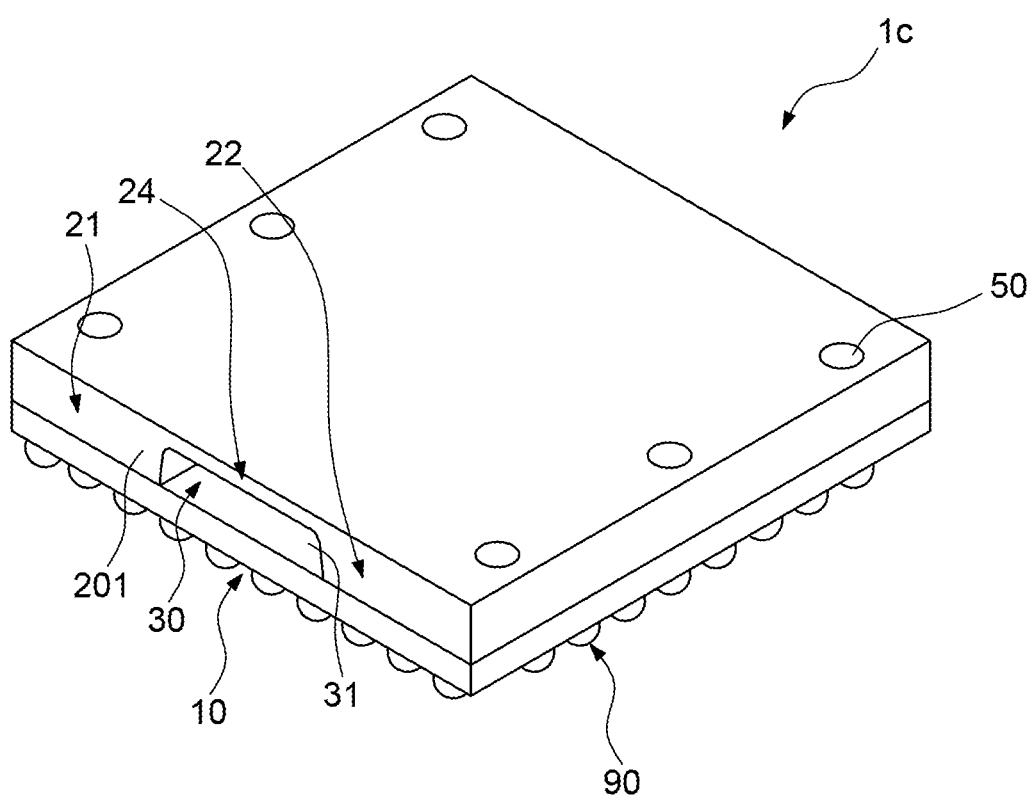
FIG. 38 illustrates one or more stages of an example of a method for manufacturing a semiconductor package structure according to some embodiments of the present disclosure.

Referring to FIG. 37 and FIG. 38, the cover material 81 is removed to form at least one passage 30, so as to obtain the semiconductor package structure 1c of FIG. 7.

Figure 39:
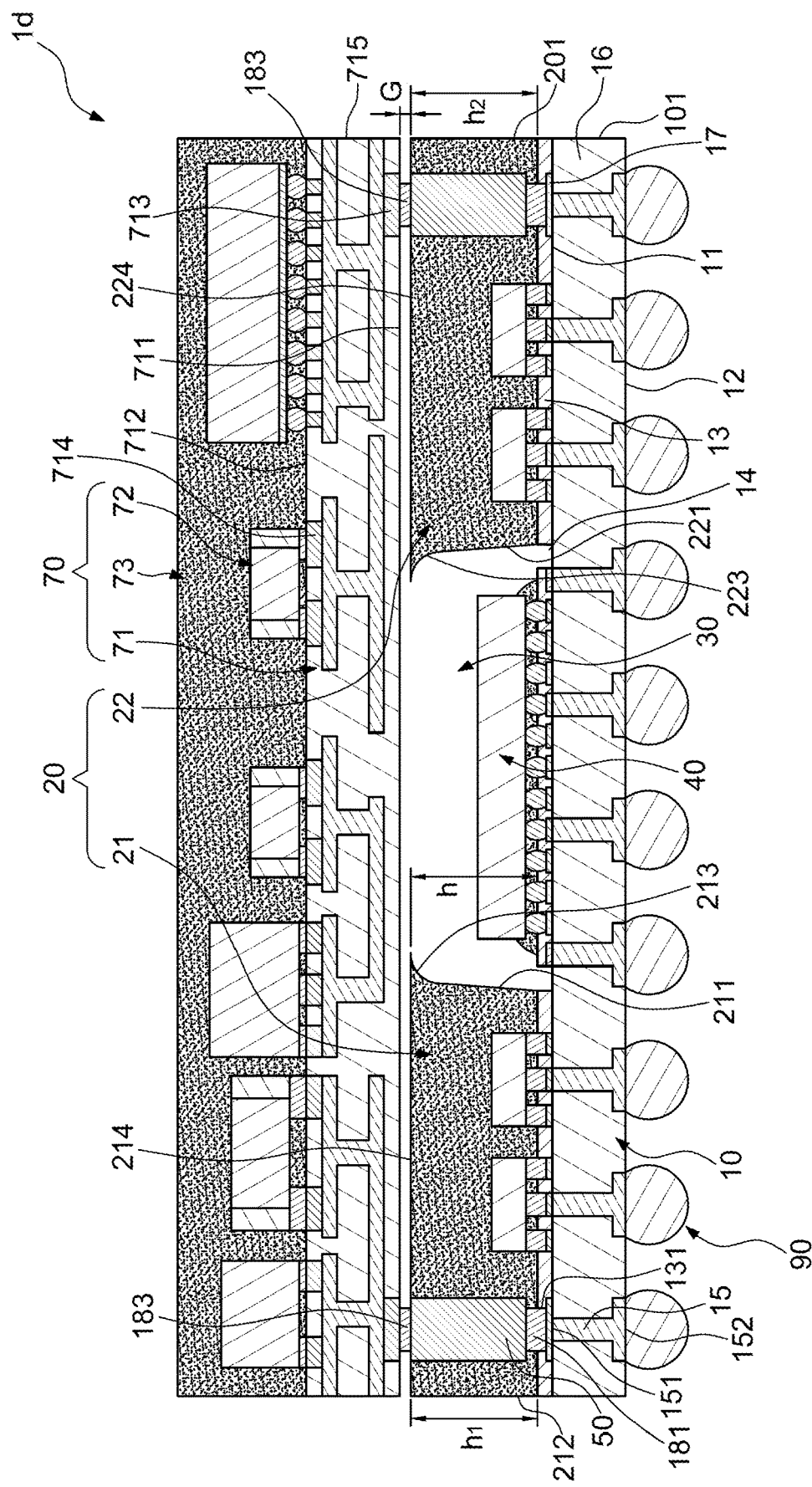
FIG. 39 illustrates one or more stages of an example of a method for manufacturing a semiconductor package structure according to some embodiments of the present disclosure.

FIG. 39 illustrates a method for manufacturing a semiconductor package structure according to some embodiments of the present disclosure. In some embodiments, the method is for manufacturing a semiconductor package structure such as the semiconductor package structure 1d shown in FIG. 8. The initial several stages of the illustrated process are the same as, or similar to, the stages illustrated in FIG. 14 and FIG. 29 through FIG. 33 for manufacturing the semiconductor package structure 1b of FIG. 6. FIG. 39 depicts a stage subsequent to that depicted in FIG. 33, which is a perspective view of a semiconductor package structure such as that shown in FIG. 6.

Referring to FIG. 6, FIG. 33 and FIG. 39, a semiconductor device 70 is disposed on and electrically connected to the interposer 50, so as to obtain the semiconductor package structure 1d of FIG. 8.

The semiconductor device 70 is disposed above the encapsulant 20 and electrically connected to the package substrate 10 through the interposer 50. In some embodiments, there is a gap G between the semiconductor device 70 and the encapsulant 20.

The semiconductor device 70 includes a device substrate 71 disposed on and electrically connected to the interposer 50, at least one electronic component 72 disposed on and electrically connected to the device substrate 71 and an encapsulant 73 disposed on the device substrate 71 to cover the electronic component 72. The device substrate 71 includes a bottom surface 711 facing the interposer 50, a top surface 712 opposite to the bottom surface 711, a plurality of first bonding pads 713 exposed from the bottom surface 711 and a plurality of second bonding pads 714 exposed from the top surface 712. In some embodiments, the first bonding pads 713 of the device substrate 71 may be electrically connected to the interposer 50 through a plurality of solder bumps 183. The electronic component 72 may be electrically connected to the second bonding pads 714.

A peripheral surface 715 of the device substrate 71 is substantially coplanar with the peripheral surface 201 of the encapsulant 20 and the peripheral surface 101 of the package substrate 10.

Figure 40:
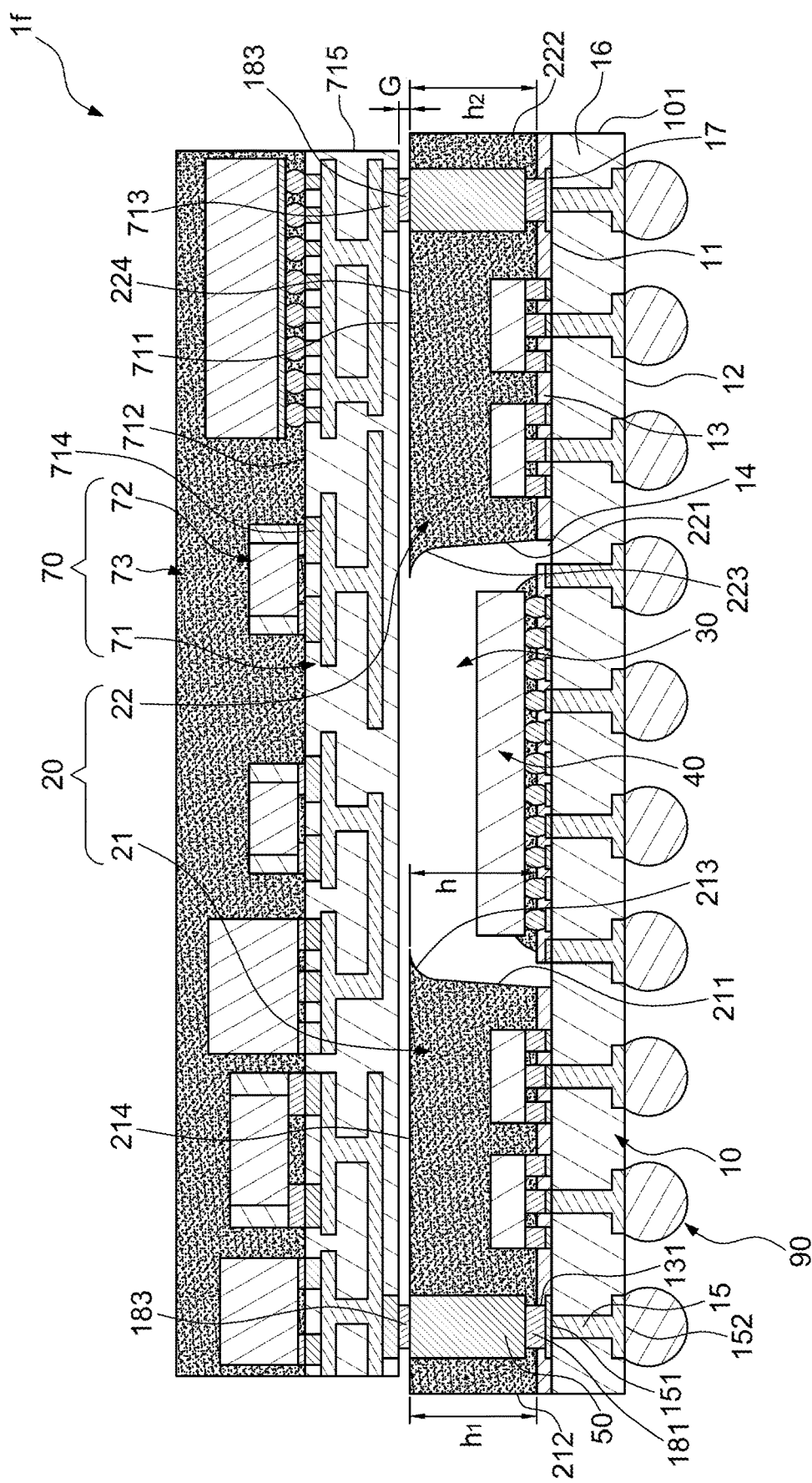
FIG. 40 illustrates one or more stages of an example of a method for manufacturing a semiconductor package structure according to some embodiments of the present disclosure.

Referring to FIG. 40, in some embodiments, the peripheral surface 715 of the device substrate 71 may be non-coplanar with the peripheral surface 201 of the encapsulant 20 and the peripheral surface 101 of the package substrate 10, and a size of the semiconductor device 70 (e.g. a longest dimension of the semiconductor device 70) is smaller than a size of the package substrate 10 (e.g. a longest dimension of the package substrate 10) such as by a factor of about 0.95 or less, a factor of about 0.9 or less, or a factor of about 0.85 or less.

Figure 41:
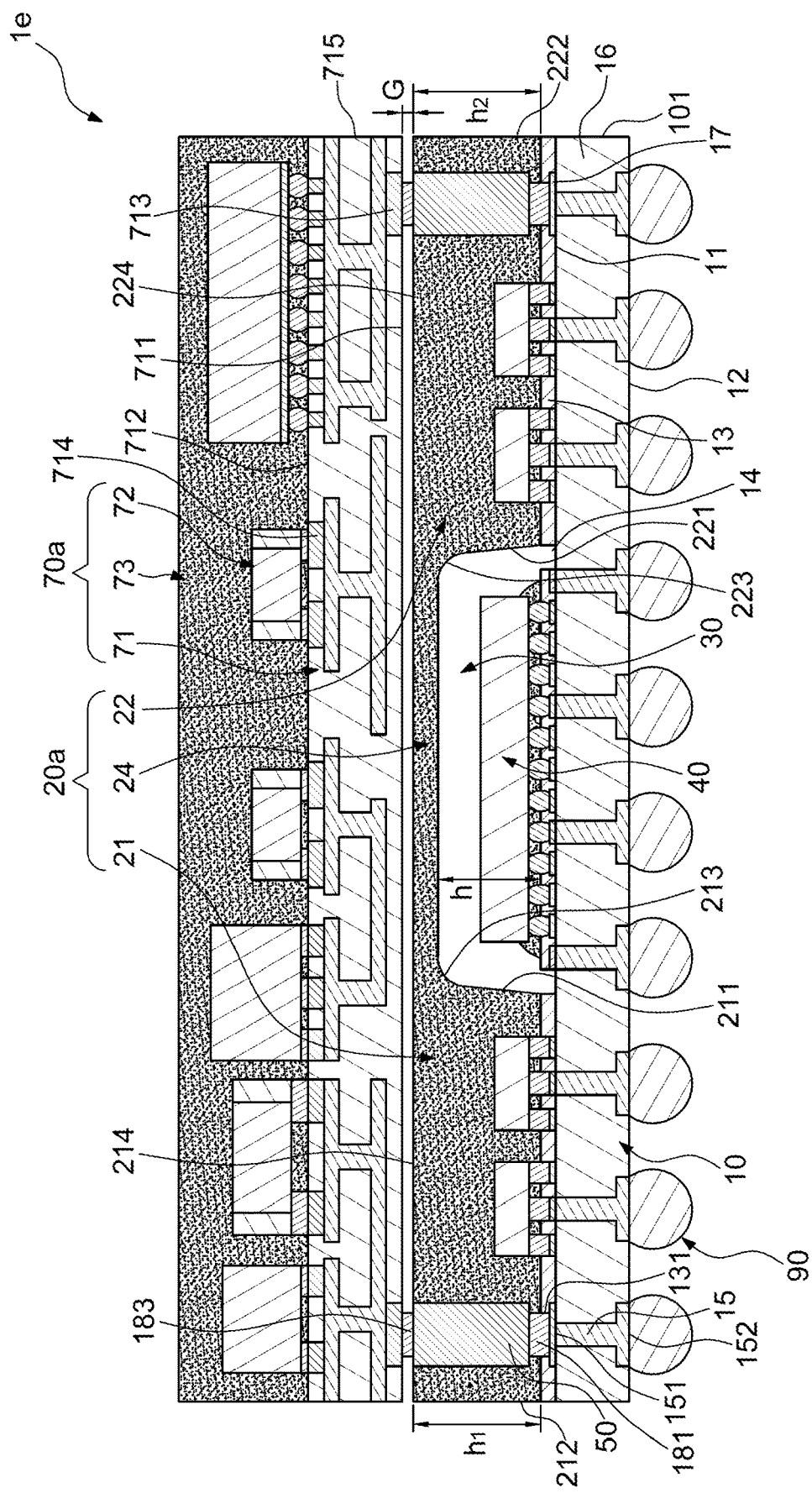
FIG. 41 illustrates one or more stages of an example of a method for manufacturing a semiconductor package structure according to some embodiments of the present disclosure.

FIG. 41 illustrates a method for manufacturing a semiconductor package structure according to some embodiments of the present disclosure. In some embodiments, the method is for manufacturing a semiconductor package structure such as the semiconductor package structure 1e shown in FIG. 9. The initial several stages of the illustrated process are the same as, or similar to, the stages illustrated in FIG. 14 and FIG. 34 through FIG. 38 for manufacturing the semiconductor package structure 1c of FIG. 7. FIG. 41 depicts a stage subsequent to that depicted in FIG. 38, which is a perspective view of a semiconductor package structure similar to that shown in FIG. 7.

Referring to FIG. 7, FIG. 38 and FIG. 41, a semiconductor device 70a is disposed on and electrically connected to the interposer 50, so as to obtain the semiconductor package structure 1e of FIG. 9.

The semiconductor device 70a is disposed above the encapsulant 20a and electrically connected to the package substrate 10 through the interposer 50. In some embodiments, there is a gap G between the semiconductor device 70a and the encapsulant 20a.

The semiconductor device 70a includes a device substrate 71 disposed on and electrically connected to the interposer 50, at least one electronic component 72 disposed on and electrically connected to the device substrate 71 and an encapsulant 73 disposed on the device substrate 71 to cover the electronic component 72. The device substrate 71 includes a bottom surface 711 facing the interposer 50, a top surface 712 opposite to the bottom surface 711, a plurality of first bonding pads 713 exposed from the bottom surface 711 and a plurality of second bonding pads 714 exposed from the top surface 712. In some embodiments, the first bonding pads 713 of the device substrate 71 may be electrically connected to the interposer 50 through a plurality of solder bumps 183. The electronic component 72 may be electrically connected to the second bonding pads 714.

A peripheral surface 715 of the device substrate 71 is substantially coplanar with the peripheral surface 201 of the encapsulant 20a and the peripheral surface 101 of the package substrate 10.

Figure 42:
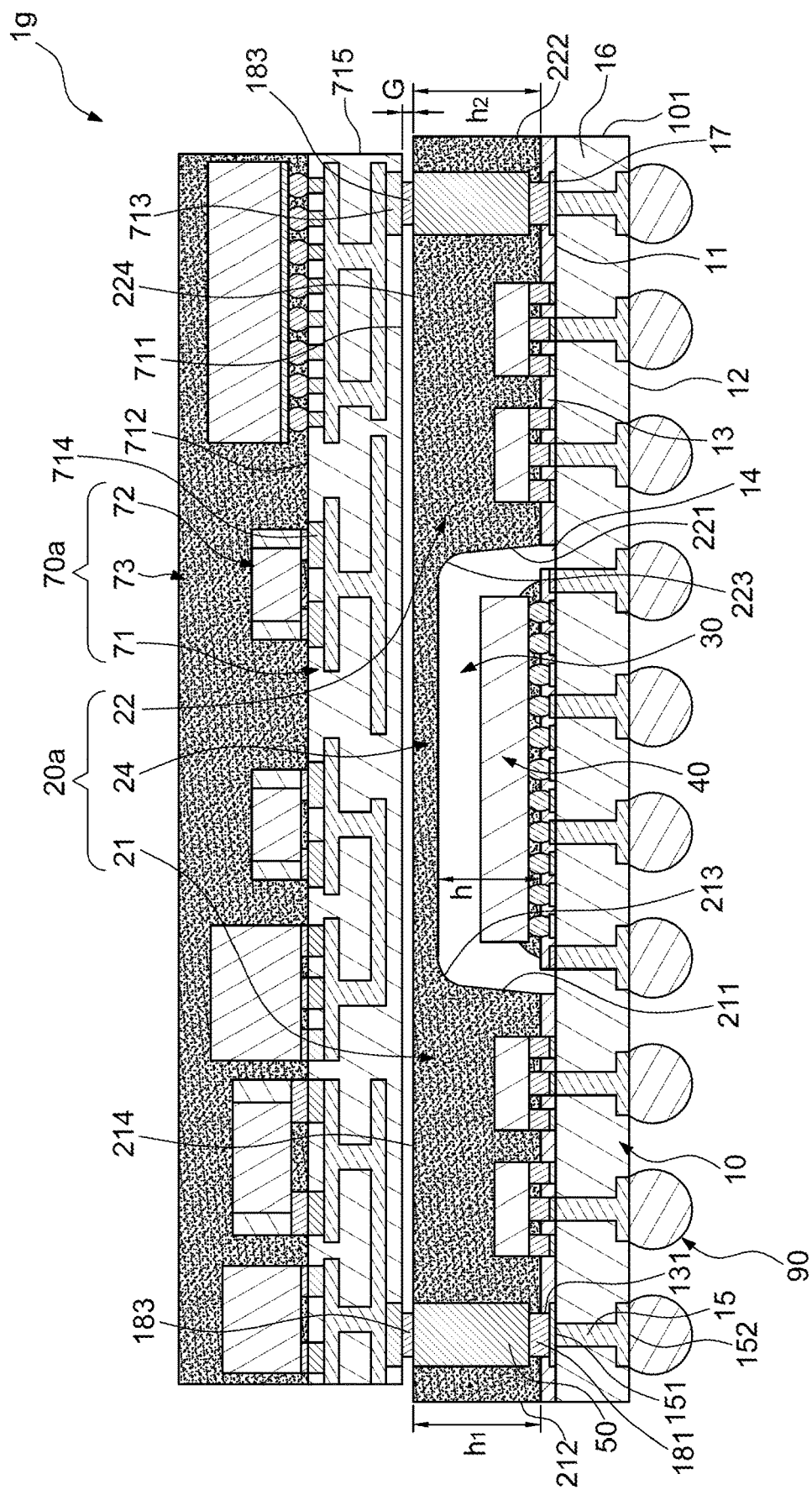
FIG. 42 illustrates one or more stages of an example of a method for manufacturing a semiconductor package structure according to some embodiments of the present disclosure.

Referring to FIG. 42, in some embodiments, the peripheral surface 715 of the device substrate 71 may be non-coplanar with the peripheral surface 201 of the encapsulant 20a and the peripheral surface 101 of the package substrate 10, and a size of the semiconductor device 70a (e.g. a longest dimension of the semiconductor device 70a) is smaller than a size of the package substrate 10 (e.g. a longest dimension of the package substrate 10) such as by a factor of about 0.95 or less, a factor of about 0.9 or less, or a factor of about 0.85 or less.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
a package substrate;
an encapsulant disposed on the package substrate and including a first encapsulant portion and a second encapsulant portion spaced apart from the first encapsulant portion;
at least one assembly module located over the encapsulant;
at least one passage defined by the first encapsulant portion, the second encapsulant portion and the assembly module; and
at least one semiconductor element disposed on the package substrate and exposed in the passage;
wherein a height of the passage is less than or equal to a height of the first encapsulant portion or a height of the second encapsulant portion.

2. The semiconductor package structure of claim 1, wherein a lower surface of the assembly module is substantially level with an upper surface of the first encapsulant portion and an upper surface of the second encapsulant portion.

3. The semiconductor package structure of claim 2, wherein the lower surface of the assembly module includes a first portion exposed from the passage and a second portion contacting the encapsulant.

4. The semiconductor package structure of claim 3, wherein the encapsulant includes a chamfer portion located at a periphery of the passage, and the chamfer portion includes a curved corner.

5. The semiconductor package structure of claim 4, wherein the height of the passage is a vertical distance from an upper surface of the package substrate to the lower surface of the assembly module.

6. The semiconductor package structure of claim 5, wherein the assembly module includes a module substrate, and a lower surface of the module substrate includes a first portion exposed from the passage and a second portion contacting the encapsulant.

7. The semiconductor package structure of claim 6, wherein the encapsulant further includes a third encapsulant portion encapsulating the module substrate.

8. The semiconductor package structure of claim 7, wherein the third encapsulant portion covers a lateral surface of the module substrate.

9. The semiconductor package structure of claim 8, wherein a lateral surface of the third encapsulant portion is substantially level with a lateral surface of the package substrate.

10. The semiconductor package structure of claim 9, wherein a width of the module substrate is less than a width of the package substrate.

11. A semiconductor package structure, comprising:
a package substrate;
a module substrate spaced apart from the package substrate;
an encapsulant contacting the package substrate and the module substrate,
the encapsulant including a first portion between the package substrate and the module substrate, wherein the first portion and the module substrate define a passage extending through the first portion; and
at least one semiconductor element exposed in the passage;
wherein an upper surface of the first portion of the encapsulant is substantially level with a bottom surface of the module substrate.

12. The semiconductor package structure of claim 11, wherein a height of the passage is less than or equal to a height of the first portion of the encapsulant.

13. The semiconductor package structure of claim 12, wherein the first portion of the encapsulant includes a chamfer portion located at an upper periphery of the passage, and the chamfer portion includes a curved corner.

14. The semiconductor package structure of claim 13, wherein the encapsulant further includes a second portion located over the module substrate, and a downward extending portion of the second portion contacts the first portion of the encapsulant.

15. The semiconductor package structure of claim 14, wherein the downward extending portion of the second portion covers a lateral surface of the module substrate.

16. The semiconductor package structure of claim 15, wherein a lateral surface of the downward extending portion is substantially level with a lateral surface of the first portion of the encapsulant.

17. The semiconductor package structure of claim 16, wherein the lateral surface of the downward extending portion is substantially level with a lateral surface of the package substrate.

18. The semiconductor package structure of claim 17, wherein a length of the downward extending portion is substantially equal to a thickness of the module substrate.

19. The semiconductor package structure of claim 18, further comprising an interposer electrically connected to the package substrate, wherein a thickness of the first portion of the encapsulant is greater than a height of the interposer.

20. The semiconductor package structure of claim 19, wherein the height of the passage is greater than the height of the interposer.

* * * * *